(12) United States Patent
Li et al.

(10) Patent No.: US 12,068,253 B2
(45) Date of Patent: Aug. 20, 2024

(54) SEMICONDUCTOR STRUCTURE WITH TWO-DIMENSIONAL CONDUCTIVE STRUCTURES

(71) Applicant: TAIWAN SEMICONDUCTOR MANUFACTURING COMPANY LTD., Hsinchu (TW)

(72) Inventors: Shu-Wei Li, Hsinchu (TW); Yu-Chen Chan, Taichung (TW); Meng-Pei Lu, Hsinchu (TW); Shin-Yi Yang, New Taipei (TW); Ming-Han Lee, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 298 days.

(21) Appl. No.: 17/395,915

(22) Filed: Aug. 6, 2021

(65) Prior Publication Data
US 2023/0037554 A1 Feb. 9, 2023

(51) Int. Cl.
*H01L 23/532* (2006.01)
*H01L 21/768* (2006.01)
*H01L 23/522* (2006.01)

(52) U.S. Cl.
CPC .. *H01L 23/53276* (2013.01); *H01L 21/76805* (2013.01); *H01L 21/76877* (2013.01); *H01L 23/5226* (2013.01); *H01L 23/53257* (2013.01); *H01L 23/53271* (2013.01); *H01L 23/5328* (2013.01)

(58) Field of Classification Search
CPC . H01L 23/53276; H01L 23/522–53295; H01L 2221/10–1094; H01L 21/768–76898
See application file for complete search history.

(56) References Cited

U.S. PATENT DOCUMENTS 11,081,447 B2 * 8/2021 Yang ................ H01L 21/76897

\* cited by examiner

*Primary Examiner* — Laura M Menz
*Assistant Examiner* — Candice Chan
(74) *Attorney, Agent, or Firm* — WPAT LAW; Anthony King

(57) ABSTRACT

A semiconductor structure and method of manufacturing a semiconductor structure are provided. The semiconductor structure comprises at least one two-dimensional (2D) conductive structure; a dielectric layer disposed on the 2D conductive structure; and at least one interconnect structure disposed in the dielectric layer and extending into the 2D conductive structure, wherein the interconnect structure laterally connects to at least one edge of the 2D conductive structure.

20 Claims, 27 Drawing Sheets

SEMICONDUCTOR STRUCTURE WITH TWO-DIMENSIONAL CONDUCTIVE STRUCTURES

BACKGROUND

The semiconductor integrated circuit (IC) industry has experienced rapid growth. Technological advances in IC materials and design have produced continuous improvements over generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, as the feature sizes continue to decrease, fabrication processes continue to become more difficult to perform. Thus, there is a challenge to form reliable semiconductor devices of smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
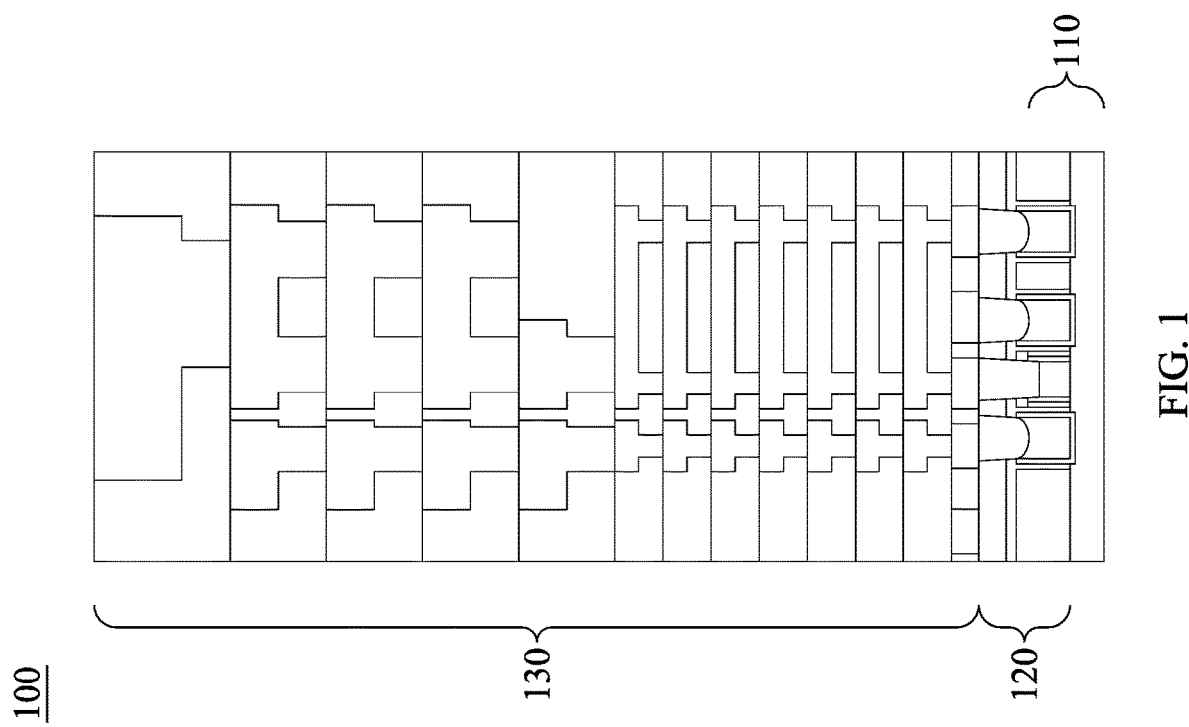
FIG. 1 is a fragmentary cross-sectional view of a semiconductor structure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

In a semiconductor device, the use of three dimensional (3D) materials (such as copper) as a conductive interconnect material is favored because of the low resistivity and high thermal conductivity. The 3D material comprises charge carrier, which can freely travel in any direction of the material. However, as the IC fabrication moves to advanced technology nodes, the IC feature size scales down to smaller dimensions and the resistivity of the 3D materials becomes higher. Improved strategy for reducing resistivity of conductive materials used in semiconductor devices may be needed.

FIG. 1 is a fragmentary cross-sectional view of a semiconductor structure 100. An IC manufacturing process flow can typically be divided into the three categories, including front-end-of-line (FEOL), middle-end-of-line (MEOL) and back-end-of-line (BEOL) processes. In some embodiments, the devices formed by the FEOL processes can be referred to as FEOL devices 110, the connecting structures formed by the MEOL processes can be referred to as MEOL connecting structures 120, and the multilayer interconnect (MLI) structures formed by the BEOL processes can be referred to as BEOL connecting structures 130. Accordingly, a semiconductor structure 100 can include the FEOL devices 110, the MEOL connecting structures 120 and the BEOL connecting structures 130. FEOL generally encompasses processes related to fabrication of IC devices, such as transistors. For example, FEOL processes can include forming isolation structures for isolating IC devices, gate structures, and source and drain structures (also referred to as source/drain structures) that form a transistor. MEOL generally encompasses processes related to fabrication of connecting structures (also referred to as contacts or plugs) that connect to conductive features (or conductive regions) of the IC devices. For example, MEOL processes can include forming connecting structures that connect to the gate structures and connecting structures that connect to the source/drain structures. BEOL generally encompasses processes related to fabrication of MLI structures that electrically connect the IC devices and the connecting structures fabricated by FEOL and MEOL processes.

The present disclosure provides a semiconductor structure and a method for forming the same. As mentioned above, the use of 3D material may be insufficient for the semiconductor structure to achieve desired performance due to the increase of the resistivity. Two-dimensional (2D) materials can be used to mitigate the increased-resistance issue while reducing the device size. The 2D materials are monolayers of material held together by strong covalent bonds and weak van der Waals forces. For example, graphene is a 2D material composed of carbon atoms tightly packed in a regular $sp^2$ bonded atomic-level hexagonal pattern and exhibits two-dimensional isotropic conduction in a two-dimensional plane of graphene sheets (GS). Due to the low density of the pi electrons, the GS is subjected to a high resistance in the direction perpendicular to the plane (i.e., lateral direction) of the GS, so that the degree of electron conduction in this direction perpendicular to the plane of the GS is low.

By virtue of such strong interlayer covalent bonding, electronic transport and therefore conductivity in layered materials is more efficient through the layers (i.e. in the lateral direction perpendicular to a vertical axis) than between the layers. Therefore, the resistance of the 2D materials in the lateral direction is smaller than that of 3D materials, which can be used to increase conductivity as the feature sizes decrease and thus improve performance of the semiconductor structure 100. In some embodiments, the semiconductor structure including the 2D material can be used to form MEOL connecting structures. For example, the semiconductor structure including the 2D material can be a MEOL metallization such as a contact or a plug. In some embodiments, the semiconductor structure including the 2D material can be used to form BEOL connecting structures. In such embodiments, the semiconductor structure including the 2D material can be a BEOL metallization such as lines that are connected to each other by vias.

FIGS. 2 to 6 illustrate a semiconductor structure 300 according to some embodiments of the present disclosure. It should be noted that same elements in FIGS. 2 to 6 are indicated by the same numerals, and can include a same material. In some embodiments, the connecting structure 300 can be a MEOL connecting structure 120 or a BEOL connecting structure 130 as shown in FIG. 1, but the disclosure is not limited thereto. As shown in FIGS. 2 to 6, the semiconductor structure 300 may include a base layer 301, at least one 2D conductive structure 302 formed on the base layer 301, a dielectric structure 303 disposed on the 2D conductive structure 302 and at least one interconnect structure 304 disposed in the dielectric structure 303 and extending into the 2D conductive structure 302.

In some embodiments, the base layer 301 may be a low-k dielectric layer. For example, the low-k dielectric layer comprises low-k dielectric materials with a k value lower than about 3.9. In some embodiments, the low-k dielectric materials have a k value ranging from about 1.5 to about 3.9. Exemplary low-k dielectric materials include fluorosilicate glass (FSG), carbon-doped silicon oxide, Black Diamond® (Applied Materials of Santa Clara, Calif.), Xerogel, Aerogel, amorphous fluorinated carbon, Parylene, benzocyclobutene (BCB), SiLK (Dow Chemical, Midland, Mich.), polyimide, other low-k dielectric materials, and combinations thereof.

In some embodiments, the base layer 301 may include a substrate (wafer). In some embodiments, the substrate includes silicon. Alternatively or additionally, the substrate includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, the substrate includes one or more group III-V materials, one or more group II-IV materials, or combinations thereof. In some implementations, the substrate is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate can include various doped regions (not shown) configured according to design requirements of a device, such as p-type doped regions, n-type doped regions, or combinations thereof. P-type doped regions (for example, p-type wells) include p-type dopants, such as boron, indium, another p-type dopant, or combinations thereof. N-type doped regions (for example, n-type wells) include n-type dopants, such as phosphorus, arsenic, another n-type dopant, or combinations thereof. In some implementations, the substrate includes doped regions formed with a combination of p-type dopants and n-type dopants. The various doped regions can be formed directly on and/or in the substrate, for example, providing a p-well structure, an n-well structure, a dual-well structure, a raised structure, or combinations thereof. An ion implantation process, a diffusion process, and/or another suitable doping process can be performed to form the various doped regions.

The 2D conductive structure 302 is formed on the base layer 301. The 2D conductive structure 302 comprises 2D materials including graphene, hexagonal boron nitride (h-BN), transition metal dichalcogenide (TMD) or a mixture thereof. In some embodiments, the 2D conductive structure 302 may have a thickness ranging from about 1 Å to about 10000 Å. In some embodiments, the 2D conductive structure 302 may have a thickness ranging from about 30 Å to about 5000 Å. In some embodiments, the 2D conductive structure may comprise one or more layers of graphene. The 2D materials include graphene, transition metal dichalcogenides (TMDs), and boron nitride (BN). The transition metal dichalcogenides (TMDs) may comprises molybdenum disulfide ($MoS_2$), tungsten disulfide ($WS_2$), tungsten ditelluride ($WTe_2$), titanium diselenide ($TiSe_2$), niobium disulfide ($NbS_2$), vanadium diselenide ($VSe_2$), niobium diselenide ($NbSe_2$), tantalum disulfide ($TaS_2$) and the like. The 2D conductive structure 302 includes one to a few monolayers of material. Monolayers may be stacked upon each other to form the conductive structure 302. For example, the 2D conductive structure 302 may comprise about 1 to about 1000 graphene layers. In some embodiments, each graphene layer may have a thickness from about 1 Å to about 5 Å. In some embodiments, each graphene layer may have a thickness from about 2.5 Å to about 4.5 Å.

In some embodiments, the 2D conductive structure 302 comprises doped graphene. In some embodiments, the graphene may be doped with nitrogen. In some embodiments, the graphene may be introduced with charge carriers through the adsorption of various gases including $NH_3$, $H_2O$, $NO_2$, and the like. In some embodiments, the 2D material layer includes graphene intercalated with intercalation components. In some embodiments, the intercalation components include metals (such as, but not limited to, Li, K, Cs, Na, etc.), organic compounds (such as, but not limited to, benzene, pyridine, furan, catechol, tetracyanoquinodimethane (TNCQ), tetrathiafulvalence (TTF), etc.), inorganic compounds (such as, but not limited to, $FeCl_3$, $MoCl_5$, $AuCl_3$, $CuCl_2$, $H_2SO_4$, $AlCl_3$, $Br_2$, $Cl_2$, $HNO_3$, etc.), polymers/oligomers (such as, but not limited to, poly(methyl methacrylate) (PMMA), polystyrene (PS), polyamide 6 (PA6), etc.), metal ionic compounds (such as, but not limited to, ferric chloride ($FeCl_3$), sodium hydroxide (NaOH), lithium boride (LiB)), halogen molecules, and a combination thereof. Such intercalation further decreases the resistivity of the 2D conductive structure 302.

Figure 3A:
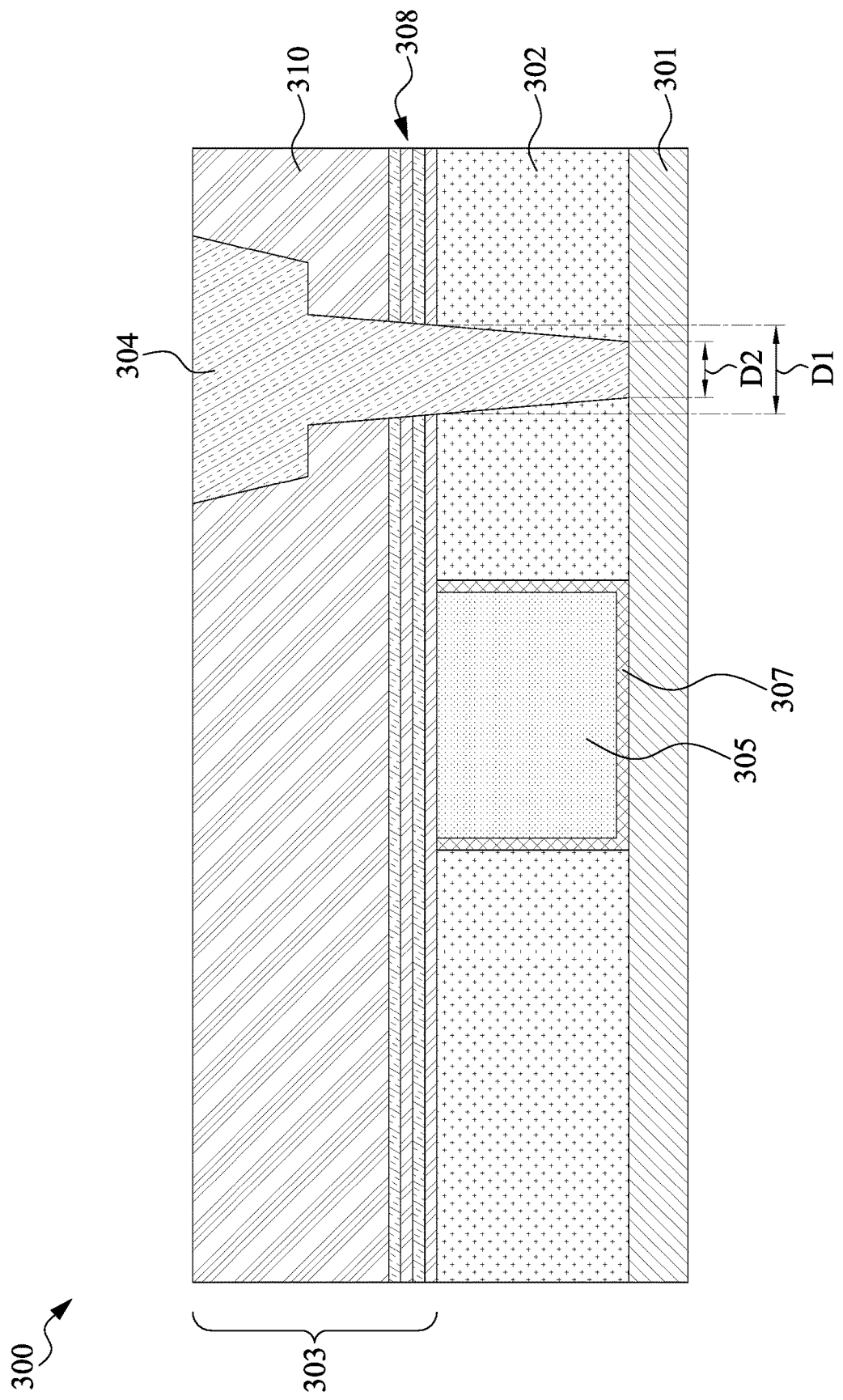
FIGS. 3A and 5A illustrate cross-sectional views of the semiconductor structure along line A-A in FIG. 2, according to the present disclosure.
Figure 3B:
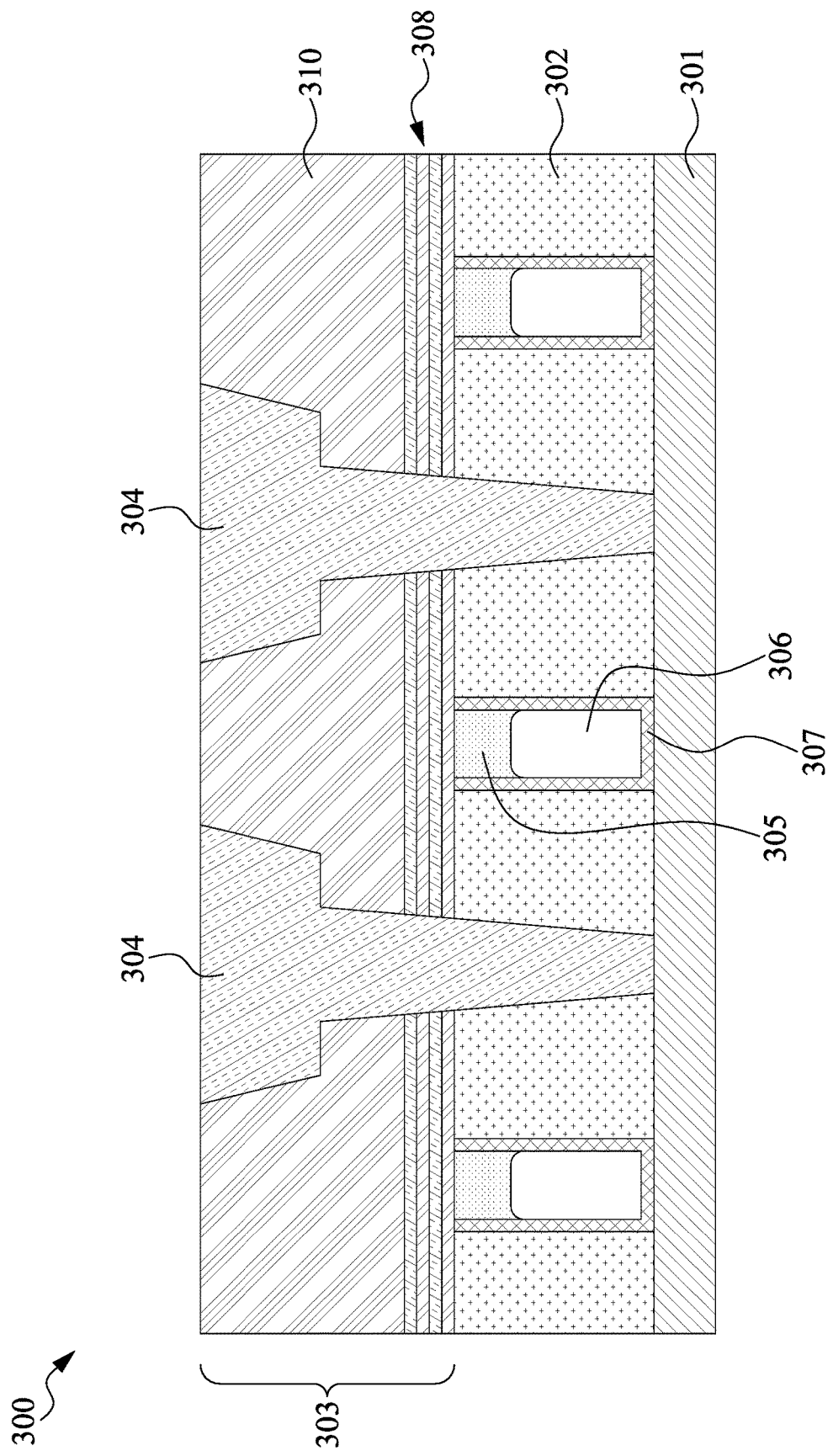
FIGS. 3B, 4, 5B and 6 illustrate cross-sectional views of the semiconductor structure along line B-B in FIG. 2, according to the present disclosure.
Figure 4:
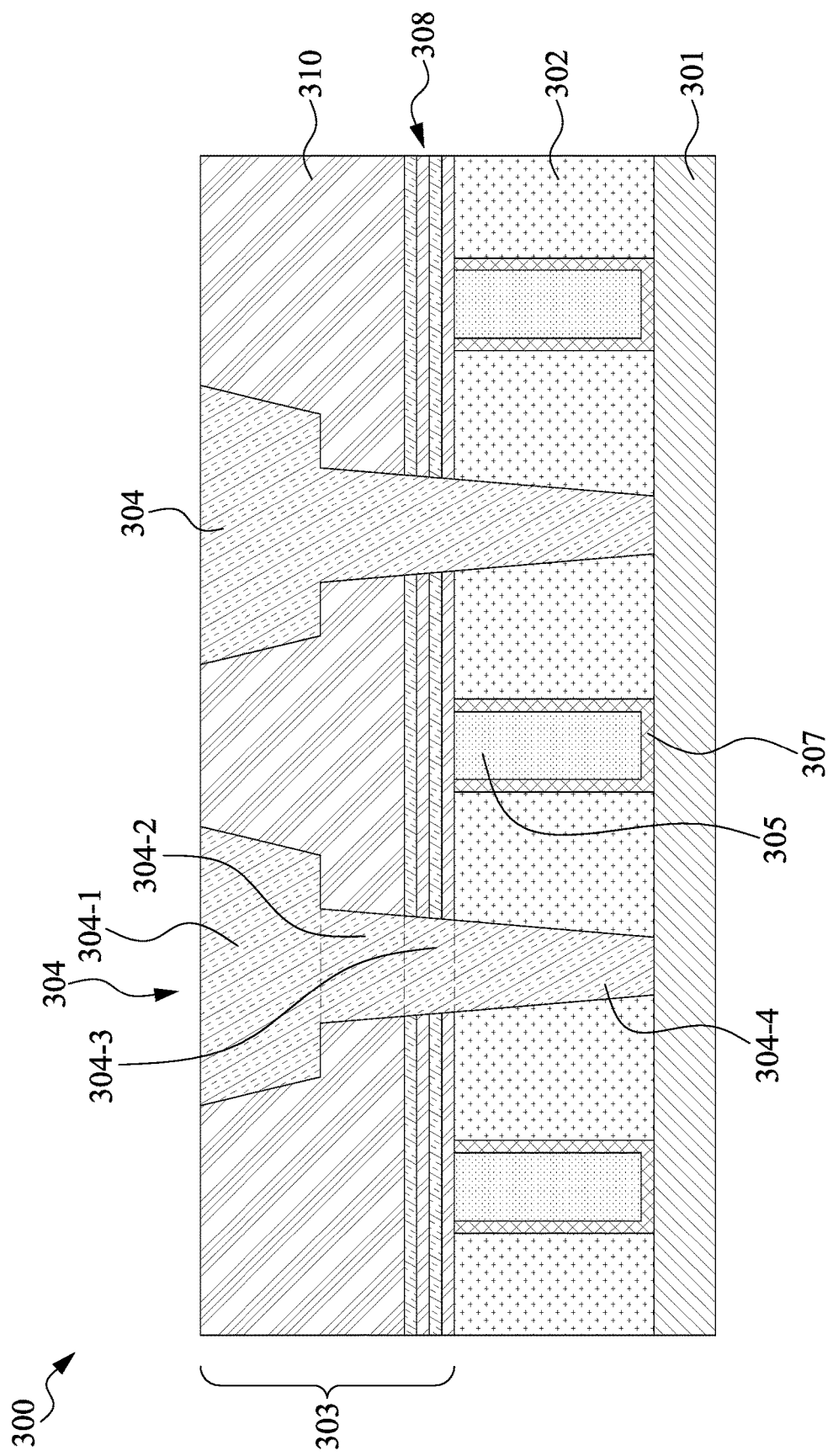
Figure 5B:
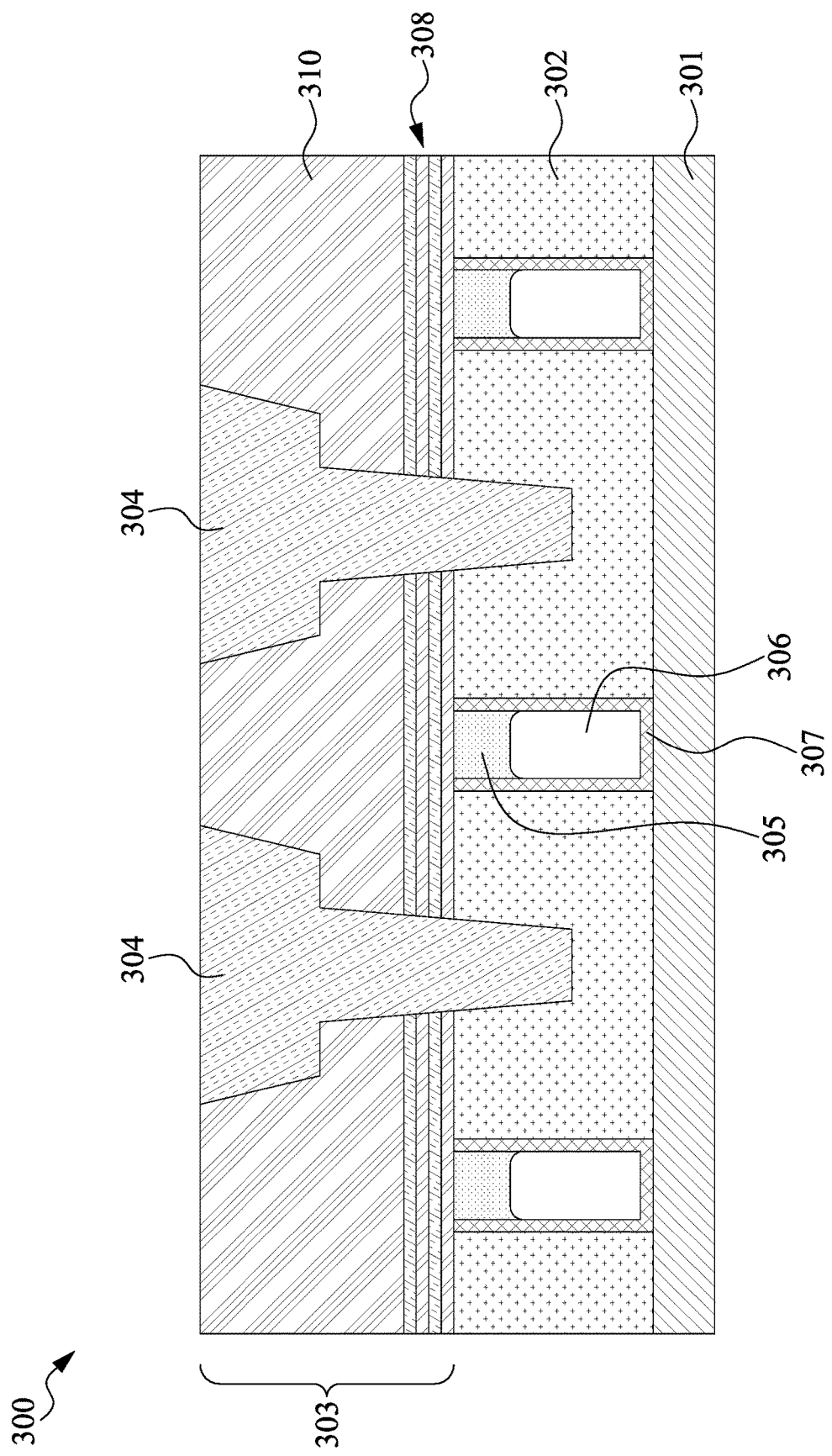
Figure 6:
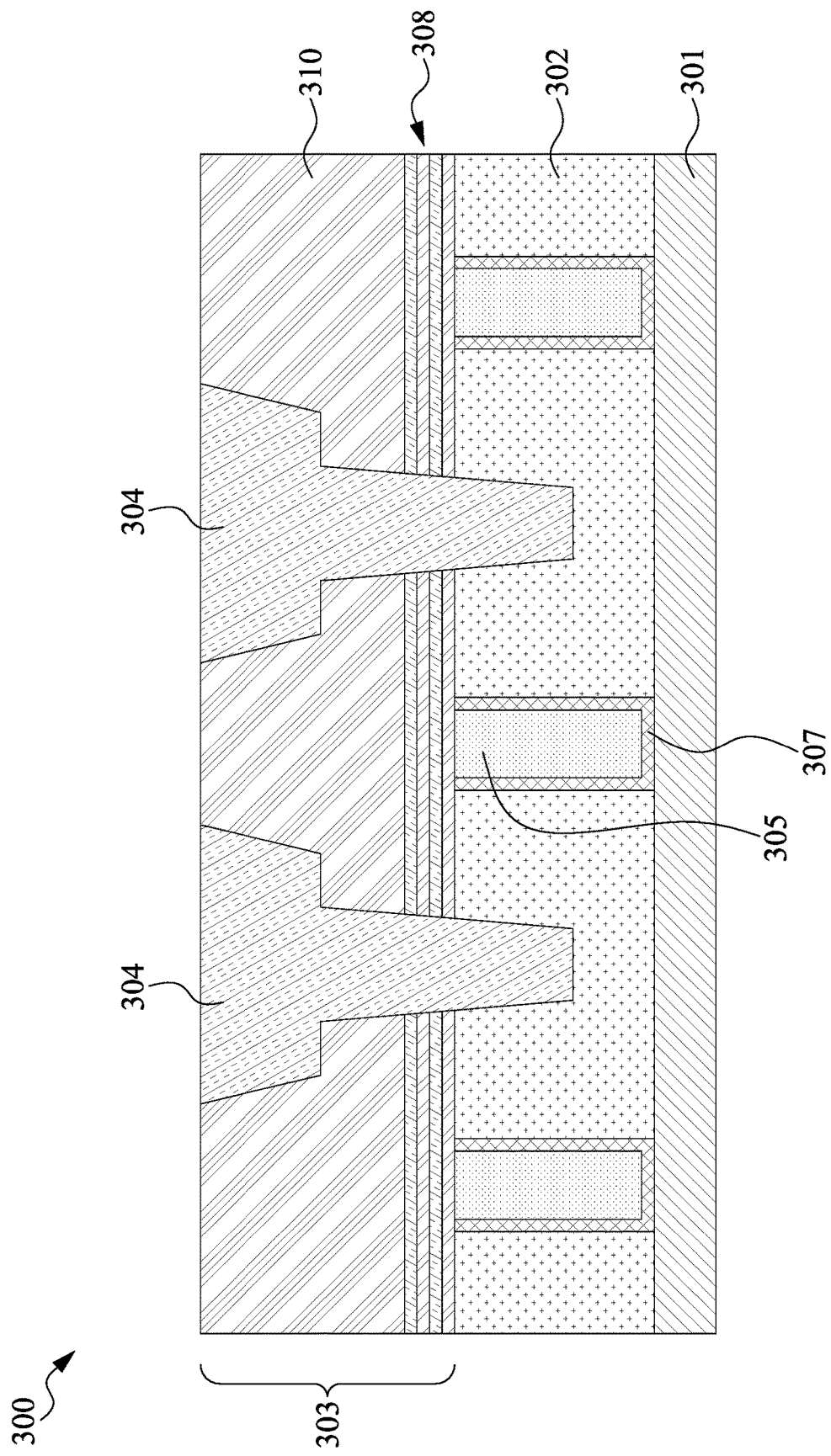

In some embodiments, as shown in FIGS. 3A, 3B and 4, the semiconductor structure 300 includes an isolation structure 305 formed on the base layer 301 to separate the 2D conductive structures 302, so that the 2D conductive structures 302 can be arranged in a desired pattern. In some embodiments, the isolation structure 305 comprises dielectric materials, air gaps or a mixture thereof. In some embodiments, the isolation structure 305 comprises dielectric materials, as shown in FIGS. 4 and 6. In some embodiments, the isolation structure 305 comprises both dielectric materials and air gaps 306, as shown in FIGS. 3B and 5B. For example, the air gaps 306 are formed below the dielectric materials in the isolation structure 305, so the dielectric materials serve as a cap of the air gaps 306. In some embodiments, the air gap 306 may be located in the lower portion of the isolation structure 305, such as from the bottom of the isolation structure 305 to about 85% of the thickness of the isolation structure 305. In some embodiments, the air gap 306 may be located from the bottom of the isolation structure 305 to about 75% of the thickness of the isolation structure 305. In some embodiments, the air gap 306 may be located from the bottom of the isolation structure 305 to about 60% of the thickness of the isolation structure 305. In some embodiments, the air gap 306 may be located from the bottom of the isolation structure 305 to about 50% of the thickness of the isolation structure 305. In some embodiments, the dielectric material may include, but not limited to, silicon oxide, silicon nitride, silicon oxynitride, silicon carbide, carbon-containing silicon oxide, silicon oxycarbide (SiOxCy), another suitable dielectric material, or combinations thereof. In some embodiments, the dielectric materials may have a dielectric constant between approximately 1 and approximately 5. In some embodiments, the dielectric material may have a low-k dielectric constant. Exemplary low-k dielectric materials include FSG, carbon-doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, another low-k dielectric material, and combinations thereof.

In some embodiments, a liner 307 may serve as a bottom and sidewall of the isolation structure 305. In some embodiments, the air gap 306 may be surrounded by the liner 307 and the dielectric materials. The liner 307 includes different materials from the dielectric materials. In some embodiments, the liner 307 may include silicon oxide (SiOx), silicon carbide (SiCx), silicon nitride (SiNx), silicon oxynitride (SixOyNz), silicon oxycarbide (SixOyCz), aluminum oxide (AlOx), aluminum nitride (AlN), transition metal carbide, transition metal nitride, transition metal oxide and other related dielectric materials.

The dielectric structure 303 stacks on the 2D conductive structure 302 and the isolation structure 305, so that the 2D conductive structure 302 and the isolation structure 305 are sandwiched by the base layer 301 and the dielectric structure 303. The dielectric structure 303 may comprise low-k dielectric materials. For example, the low-k dielectric materials may have a k value lower than about 3.9. In some embodiments, the low-k dielectric materials may have a k value ranging from about 1.5 to about 3.9. Exemplary low-k dielectric materials include fluorosilicate glass (FSG), carbon-doped silicon oxide, Black Diamond® (Applied Materials of Santa Clara, Calif.), Xerogel, Aerogel, amorphous fluorinated carbon, Parylene, benzocyclobutene (BCB), SiLK (Dow Chemical, Midland, Mich.), polyimide, other low-k dielectric materials, and combinations thereof.

In some embodiments, the dielectric structure 303 can include a multi-layered structure. For example, the dielectric structure 303 can further include an etching stop layer (ESL)-oxide-etching stop layer (ESL)-oxide (LOLO) structure 308 overlying the 2D conductive structure 302 and the isolation structure 305, and a dielectric layer 310 overlying the LOLO structure 308, but the disclosure is not limited thereto. Materials used to form the LOLO structure 308 may be identical or similar to those for the dielectric material as described above; therefore, repeated descriptions of such details are omitted for brevity. In some embodiments, materials of the dielectric layer 310 may be different from those of the LOLO structure 308. In some embodiments, the dielectric structure 303 may have a thickness ranging from about 1 Å to about 10000 Å. In some embodiments, the dielectric structure 303 may have a thickness ranging from about 30 Å to about 5000 Å.

The interconnect structure 304 is disposed in the dielectric structure 303 and extends into the 2D conductive structure 302, so that the interconnect structure 304 laterally contacts at least one edge of the 2D conductive structure 302. Since the 2D conductive structure 302 has smaller resistance in the lateral direction, laterally contacting the interconnect structure 304 to the 2D conductive structure 302 reduces contact resistance between the interconnect structure 304 and the 2D conductive structure 302. In some embodiments, the interconnect structure 304 comprises 3D materials, including metallic materials, such as copper, tungsten and so on. Such heterogeneous integration of the 2D materials of the 2D conductive structure 302 and 3D materials of the interconnect structure 304 improves the performance of the semiconductor structure 100. In some embodiments, a barrier layer (not shown) can be disposed between the interconnect structure 304 and the dielectric structure 303. In some embodiments, the barrier layer can include titanium (Ti), tantalum (Ta), titanium nitride (TiN), tantalum nitride (TaN), and other metal nitrides.

Figure 5A:
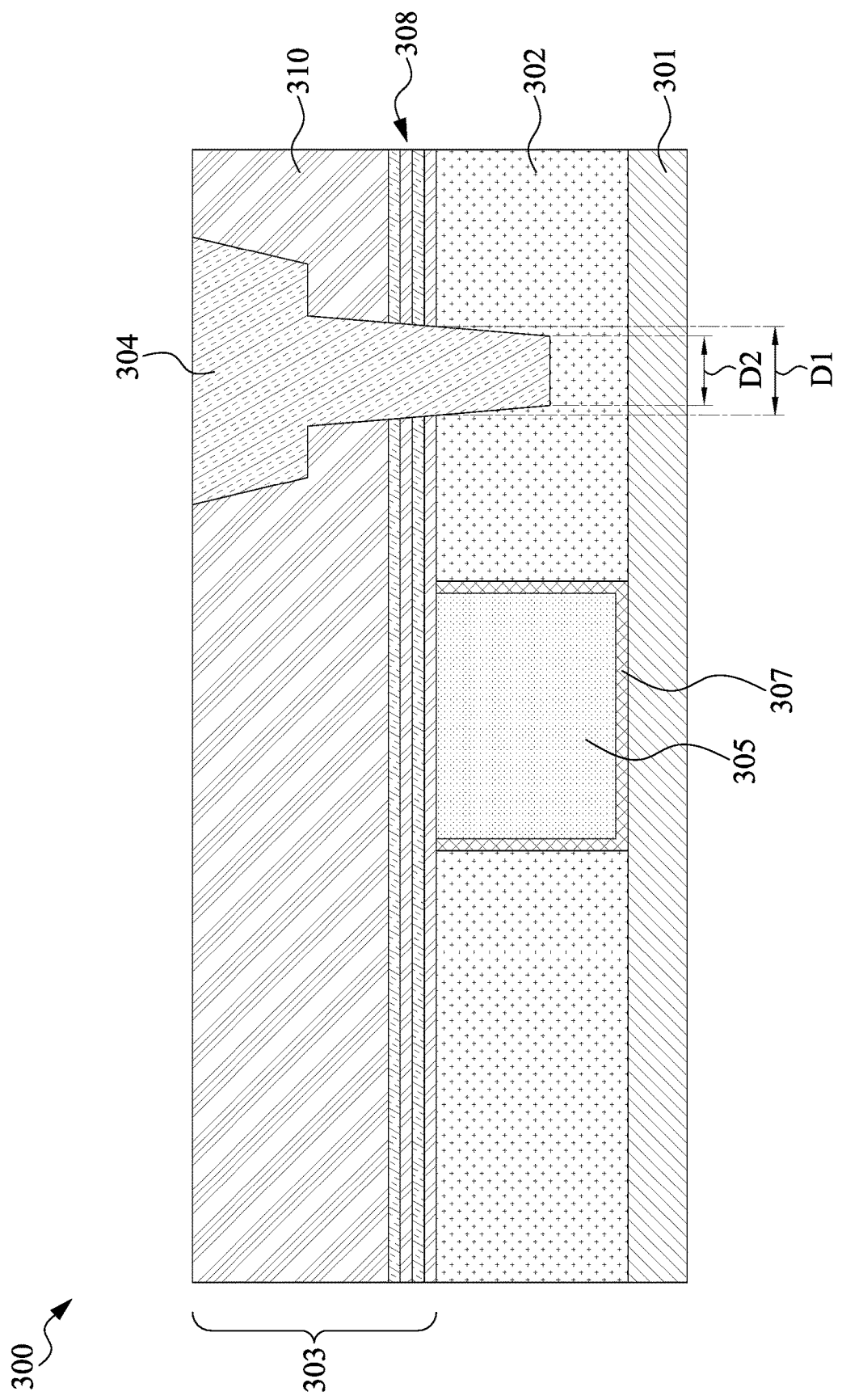

In some embodiments, as shown in FIGS. 3A and 5A, the interconnect structure 304 has a vertical cross sectional shape, which can be a rectangular shape, tapered shape, reversed triangle shape and so on. For example, the interconnect structure 304 may have a tapered vertical cross sectional shape with a first diameter D1 at an interface of the 2D conductive structure 302 and the dielectric structure 303 and a second diameter D2 at the bottom of the interconnect structure 304, wherein the first diameter D1 is wider than the second diameter D2 to increase the contact surface area between the interconnect structure 304 and the 2D conductive structure 302 and thus improve conductivity of the semiconductor structure 100. In some embodiments, the ratio of the first diameter D1 to the second diameter D2 is at least about 1.1. In some embodiments, the ratio of the first diameter D1 to the second diameter D2 is about 1.1 to about 5. In some embodiments, the ratio of the first diameter D1 to the second diameter D2 is about 1.5 to about 2.5 times. As the ratio of the first diameter D1 to the second diameter D2 is between about 1.5 and about 2.5, the contact surface area between the interconnect structure 304 and the 2D conductive structure 302 can be increased to improve the conductivity of the semiconductor structure 100 without significantly increasing layout area of the interconnect structure 304.

In some embodiments, as shown in FIGS. 3A, 3B and 4, the interconnect structure 304 extends through the 2D conductive structure 302 and contacts the base layer 301, so the sidewall of the interconnect structure 304 abuts the 2D conductive structure 302 while the bottom of the interconnect structure 304 contacts the base layer 301. In some other embodiments, as shown in FIGS. 5A, 5B and 6, the interconnect structure 304 may extend into the 2D conductive structure 302 in a depth of at least about 10% of the total thickness of the 2D conductive structure 302. For example, the interconnect structure 304 may extend into the 2D conductive structure 302 in a depth of about 10% to about 95% of the total thickness of the 2D conductive structure 302. In some embodiments, the interconnect structure 304 may extend into the 2D conductive structure 302 in a depth of about 35% to about 90% of the total thickness of the 2D conductive structure 302. In some embodiments, the interconnect structure 304 may extend into the 2D conductive structure 302 in a depth of about 50% to about 85% of the total thickness of the 2D conductive structure 302. As the depth of the interconnect structure 304 with respect to the 2D conductive structure 302 in the range from about 10% to about 95%, the lateral contact between the interconnect structure 304 and the 2D conductive structure 302 would be sufficient for some semiconductor structures while an over-etch of the base layer 301 may be alleviated.

Figure 2:
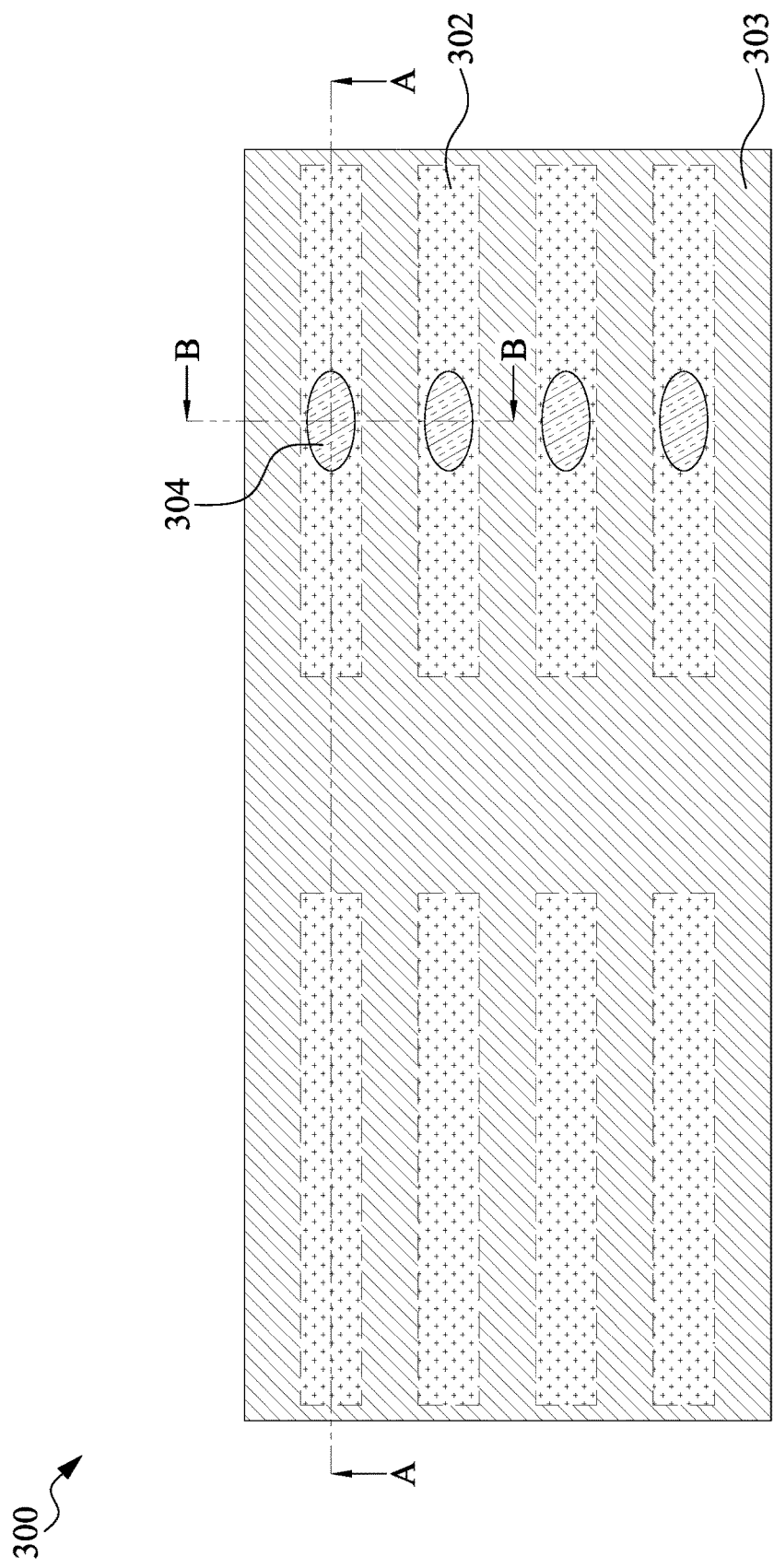
FIG. 2 is a top view of a dielectric layer with a plurality of interconnect structures of a semiconductor structure, in accordance with some embodiments of the present disclosure.

In some embodiments, as shown in FIG. 2, the interconnect structure 304 extends into the middle portion of the 2D conductive structure 302, so that the lower part of the interconnect structure 304 is embedded in the 2D conductive structure 302 as shown in FIGS. 3A and 5A and may not contact the edge of the 2D conductive structure 302.

Figure 7:
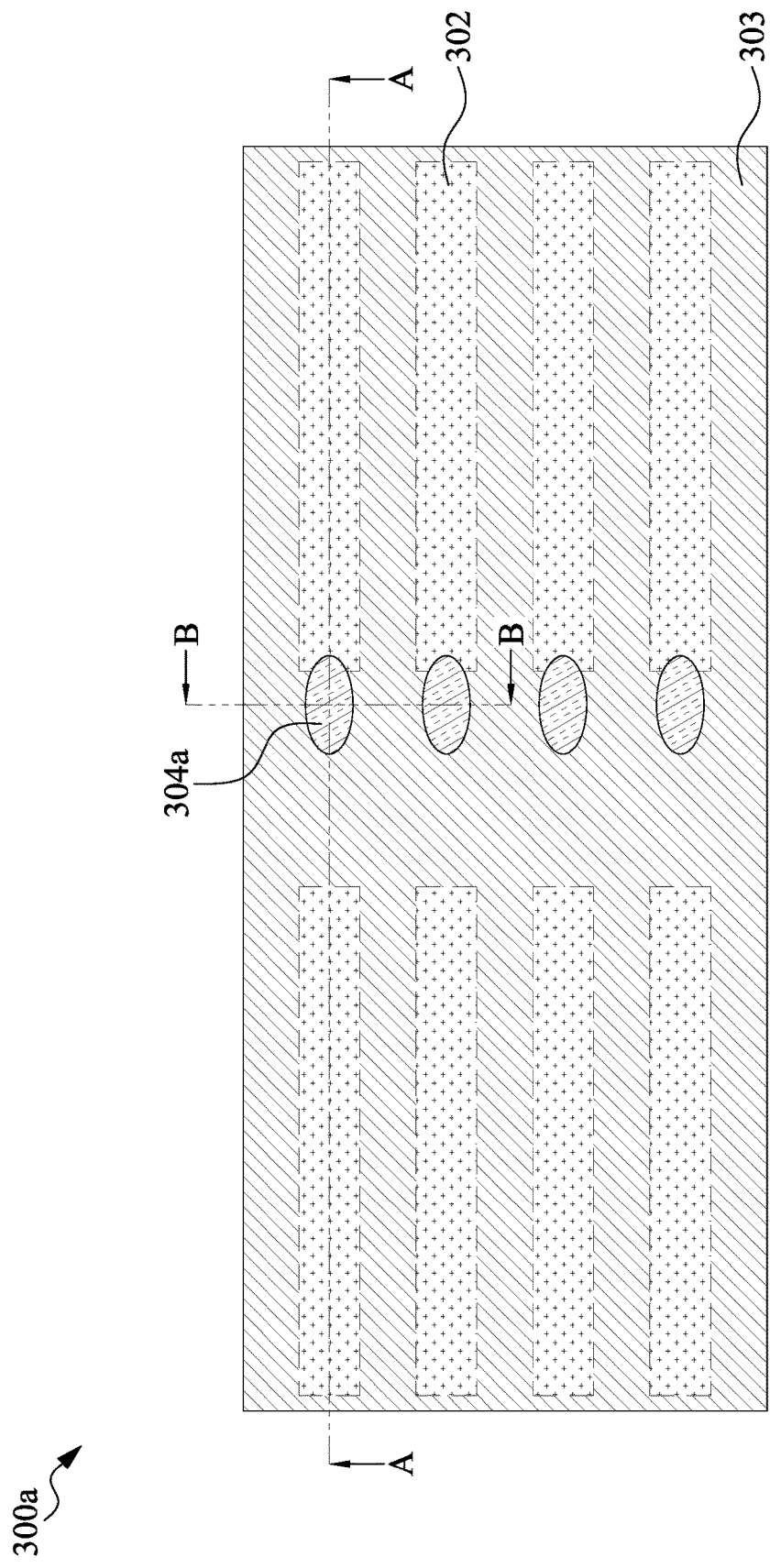
FIG. 7 is a top view of a dielectric layer with a plurality of interconnect structures of a semiconductor structure, in accordance with some embodiments of the present disclosure.
Figure 8A:
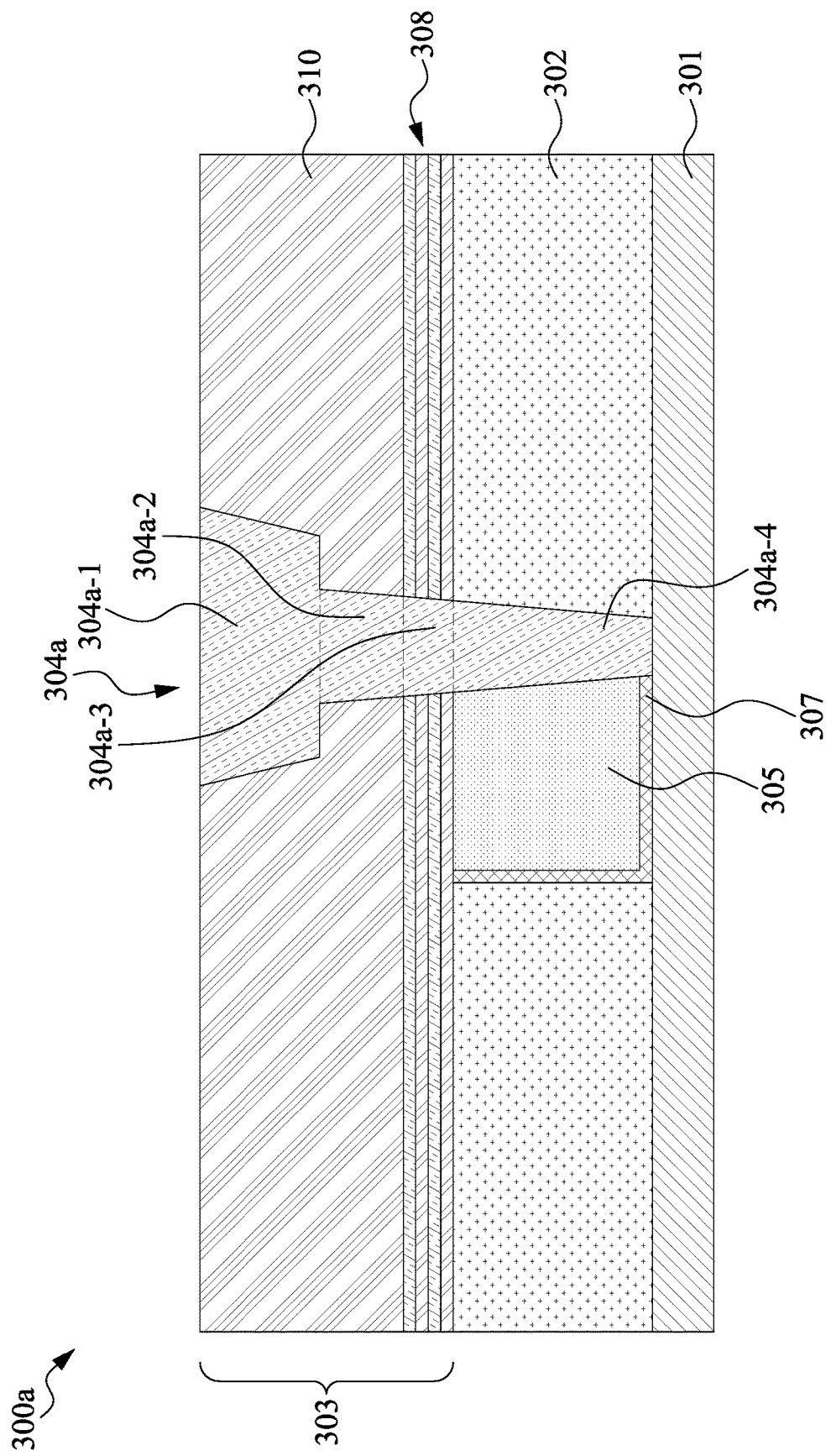
FIGS. 8A and 9A illustrate cross-sectional views of the semiconductor structure along line A-A in FIG. 7, according to the present disclosure.
Figure 9A:
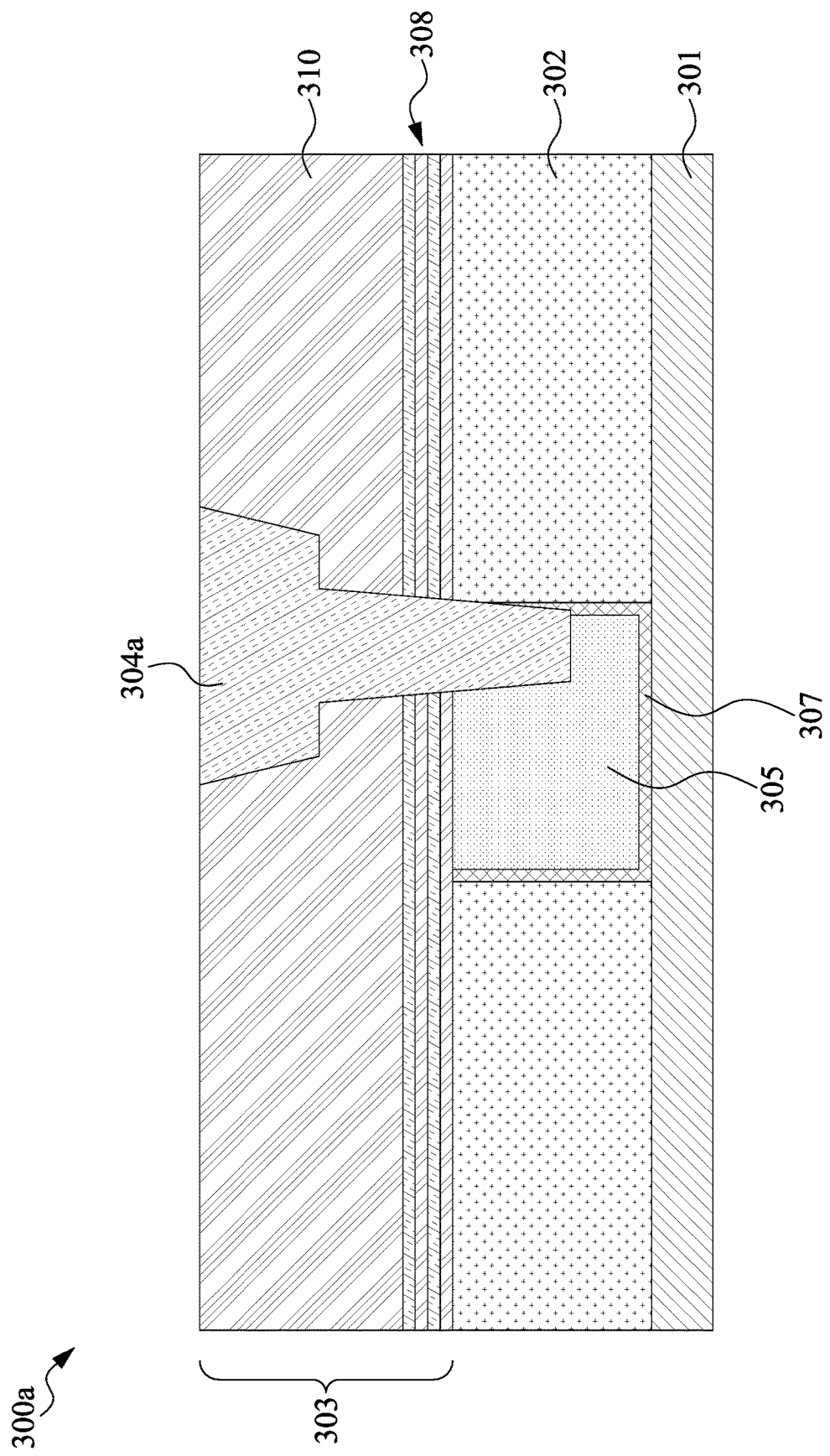

In some other embodiments, as shown in FIG. 7, the interconnect structure 304a extends along an edge of the 2D conductive structure 302, so that the interconnect structure 304 laterally contact the edge of the 2D conductive structure 304 as shown in FIGS. 8A and 9A, which are describe below in detail.

FIGS. 7, 8, 9A and 9B illustrate a semiconductor structure 300a according to some other embodiments of the present disclosure. It should be noted that same elements in FIGS. 2 to 6 are indicated by the same numerals, and repeated descriptions of those elements can be omitted for brevity. It should be noted that the embodiments shown in FIGS. 2 to 6 and those shown in FIGS. 7 to 9 may be incorporated in one semiconductor device as desired. As shown in FIGS. 7 to 9, the semiconductor structure 300a may include a base layer 301, at least one 2D conductive structure 302 formed on the base layer 301, a dielectric structure 303 disposed on the 2D conductive structure 302 and at least one interconnect structure 304a disposed in the dielectric structure 303 and extending into the 2D conductive structure 302.

As shown in FIGS. 7, 8A and 9A, at least one 2D conductive structure 302 is disposed on the base layer 301 and surrounded by the isolation structure 305. The 2D conductive structure 302 has at least one edge. The interconnect structure 304a is disposed in the dielectric structure 303 and extends along an interface of the 2D conductive structure 302 and the isolation structure 305, so that a portion of the interconnect structure 304a laterally contacts to the at least one edge of the 2D conductive structure 302, and the other portion of the interconnect structure 304a laterally contacts the isolation structure 305. Therefore, the lower part of the interconnect structure 304a is surrounded by the 2D conductive structure 302 and the isolation structure 305. In this case, the interconnect structure 304a still can laterally contact the 2D conductive structure 302 so as to improve conductivity of the semiconductor structure 300a.

Figure 8B:
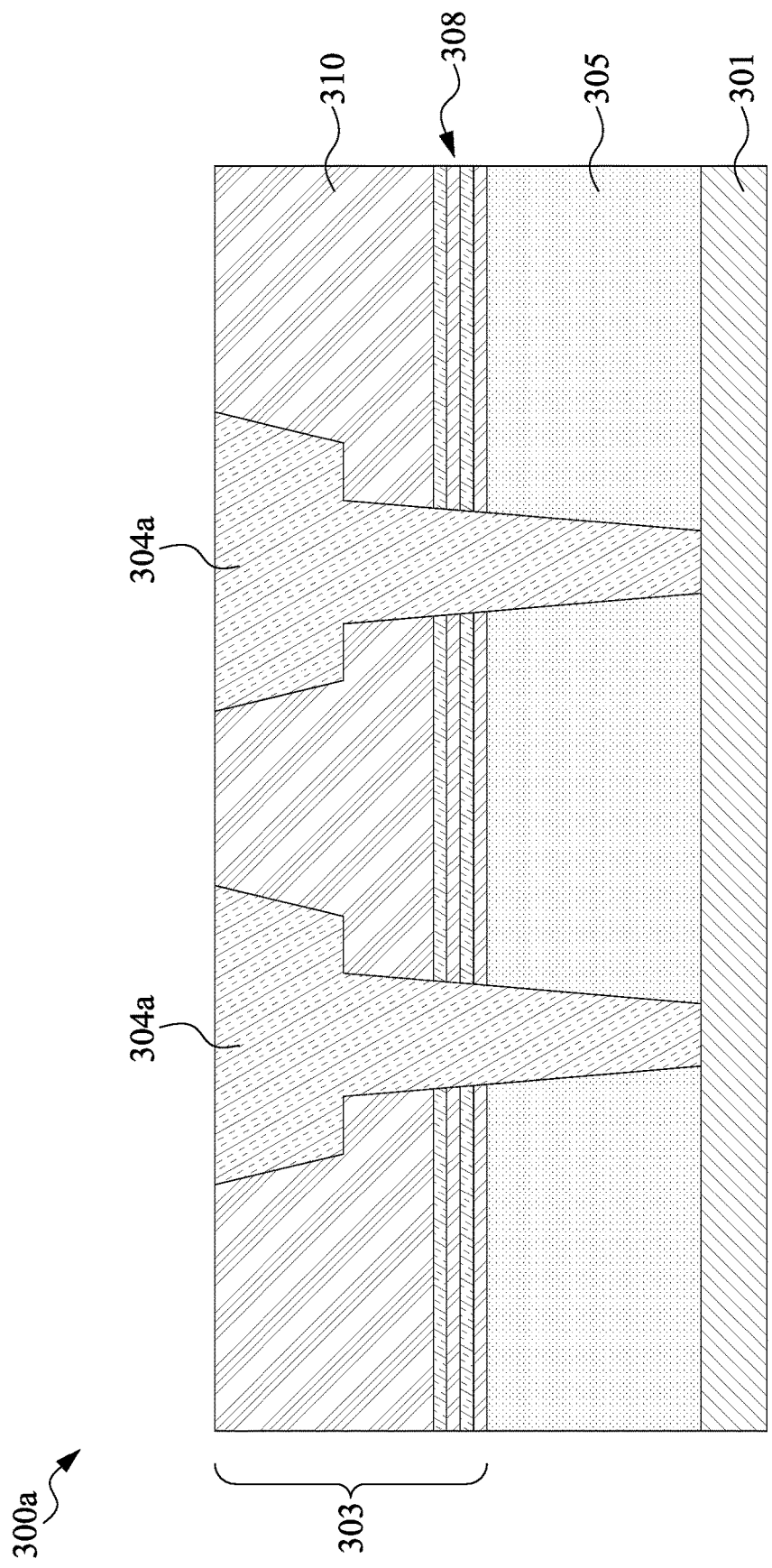
FIGS. 8B and 9B illustrate cross-sectional views of the semiconductor structure along line B-B in FIG. 7, according to the present disclosure.
Figure 9B:
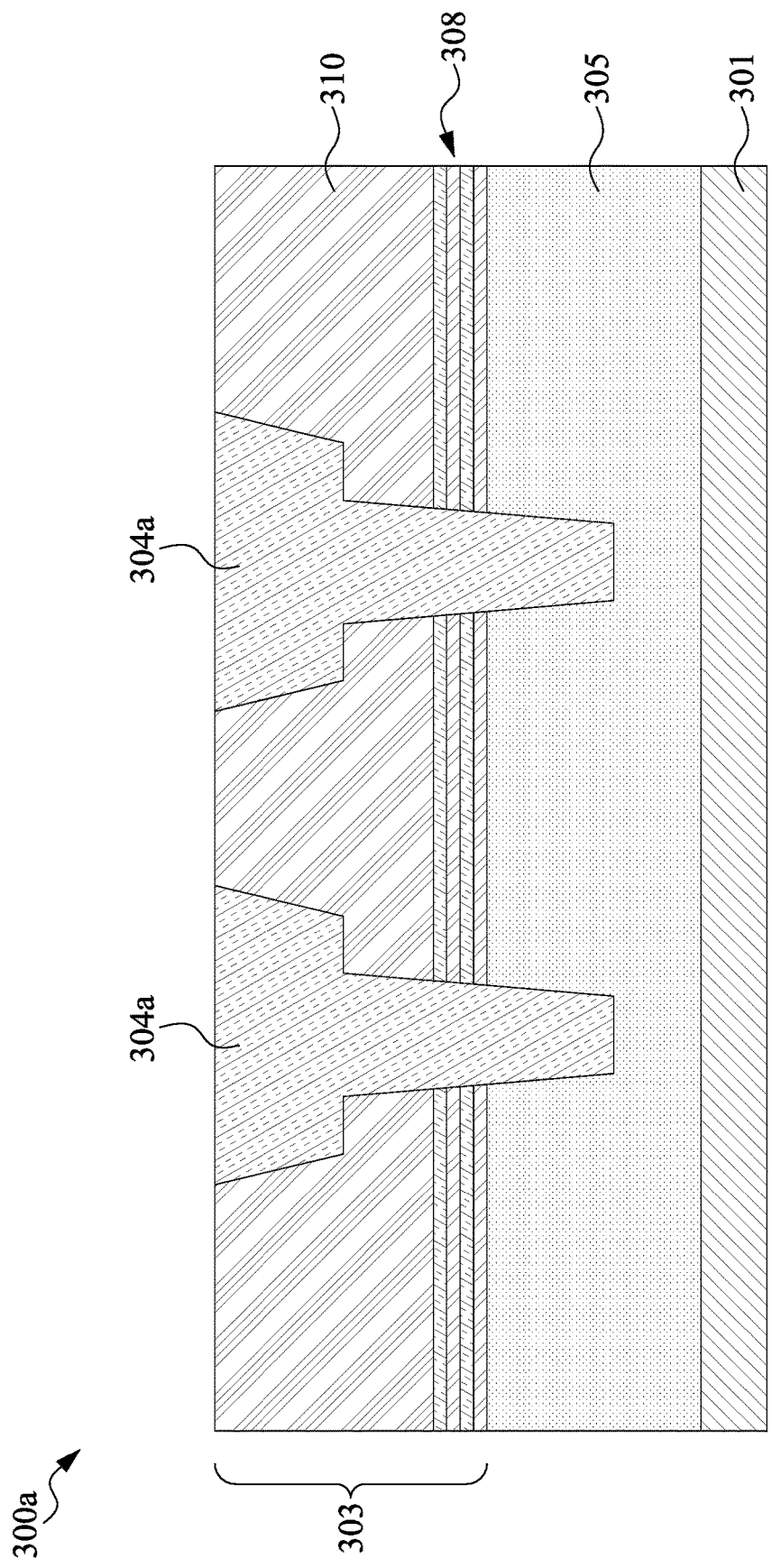

In some embodiments, as shown in FIGS. 8A and 8B, the sidewall of the interconnect structure 304a partially abuts the 2D conductive structure 302 and partially abuts the isolation structure 305 while the bottom of the interconnect structure 304a contacts the base layer 301. In some embodiments, as shown in FIGS. 9A and 9B, the sidewall of the interconnect structure 304a partially abuts the 2D conductive structure 302 and partially abuts the isolation structure 305 while the bottom of the interconnect structure 304a contacts the isolation structure 305. In some embodiments, the sidewall of the interconnect structure 304a partially abuts the 2D conductive structure 302 and partially abuts the isolation structure 305 while the bottom of the interconnect structure 304a contacts the 2D conductive structure 302. In some embodiments, the sidewall of the interconnect structure 304a partially abuts the 2D conductive structure 302 and partially abuts the isolation structure 305 while the bottom of the interconnect structure 304a partially contacts the 2D conductive structure 302 and partially contacts the isolation structure 305.

In some embodiments, with reference to FIGS. 4 and 8A, each interconnect structure 304 and 304a may have a multi-part profile because the interconnect structure 304 and 304a is formed through various materials, which may have different etch rates. For example, each interconnect structure 304 and 304a may have at-least-three-part profile, including a top part of the interconnect structure 304 and 304a is disposed in the dielectric structure 303, which may be divided into an upper contact part and an upper connecting part, and a bottom part of the interconnect structure 304 and 304a is at least partially disposed in the 2D conductive structure 302. Since the dielectric structure 303 may be a multi-layered structure, each interconnect structure 304 and 304a may have a four-part profile, a five-part profile or more.

Figure 10C:
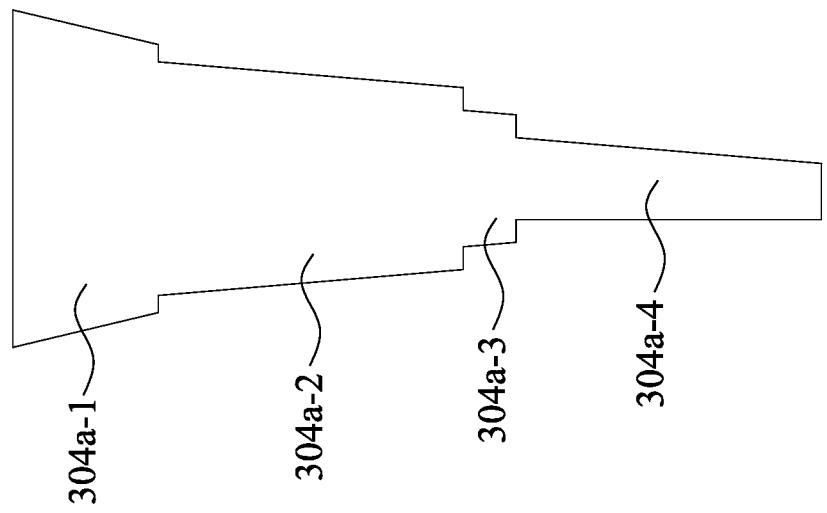
FIGS. 10A, 10B and 10C illustrate cross-sectional views of interconnect structures of a semiconductor structure, in accordance with various embodiments of the present disclosure.
Figure 10B:
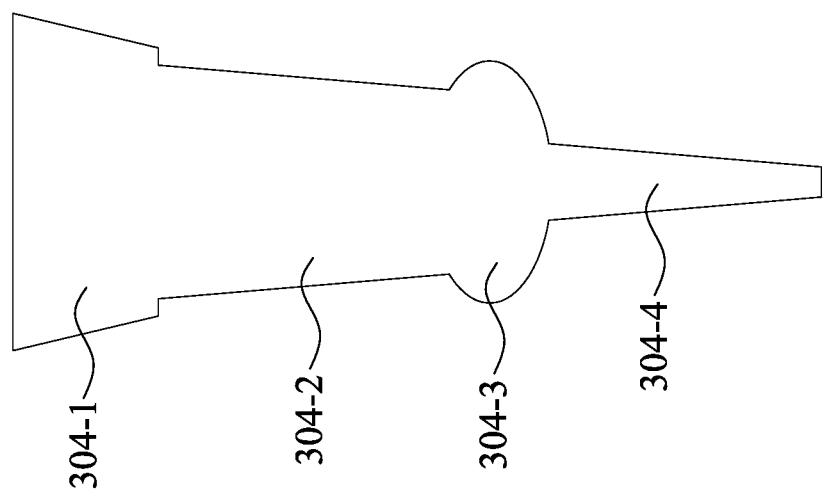
Figure 10A:
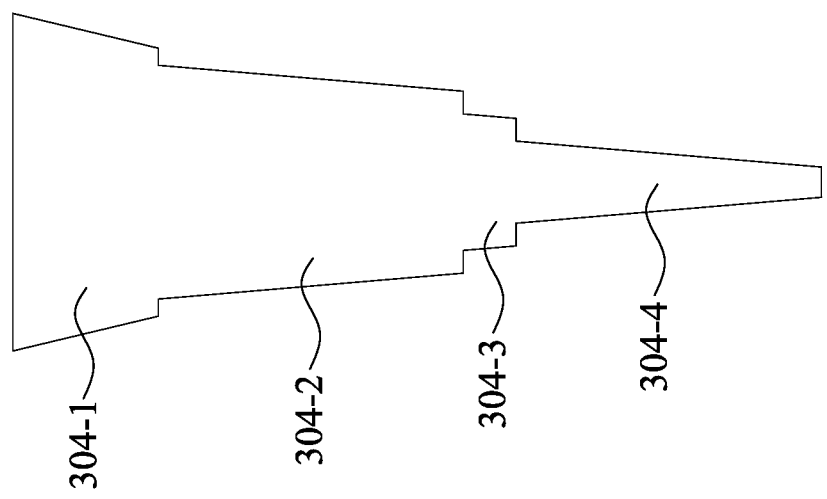

In some embodiments, as shown in FIGS. 4 and 10A, each interconnect structure 304 may have a four-part profile, including an upper contact part 304-1 and an upper connecting part 304-2, which are disposed in the dielectric layer 310, a middle part 304-3 disposed in the LOLO structure 308 and a bottom part 304-4 disposed in the 2D conductive structure 302. Each of the four parts (including the upper contact region 304-1, the lower connecting region 304-2, the middle part 304-3 and the bottom part 304-4) has a trapezoidal cross section where the top is larger than the bottom, and the bottom of one part is larger than the top of the underneath part. Hence, the four-part profile may be a step profile with a stepwisely decreased width from the upper part to the lower part. In some embodiments, with different materials for the LOLO structure 308, the shape of the vertical cross section of the middle part 304-3 may be varied. For example, the middle part 304-3 may have a convex cross-sectional shape as shown in FIG. 10B, but the disclosure is not limited thereto. In some another embodiments, the middle part 304-3 may have a concave cross section and so on.

In some embodiments, as shown in FIGS. 8A and 10C, each interconnect structure 304a may have a four-part profile, including an upper contact part 304a-1 and a upper connecting part 304a-2, which are disposed in the dielectric layer 310, a middle part 304a-3 disposed in the LOLO structure 308 and a bottom part 304a-4 disposed between the 2D conductive structure 302 and the isolation structure 305. Different parts may have different vertical cross-sectional shapes as mentioned above. In some embodiments, since the bottom part 304a-4 is disposed between the 2D conductive structure 302 and the isolation structure 305, which may have identical or different etch rates. In some embodiments, the vertical cross section of the bottom part 304a-4 may be symmetric when, for example, the 2D conductive structure 302 and the isolation structure 305 may have the same or similar etch rate. In some embodiments, the vertical cross section of the bottom part 304a-4 may be asymmetric when, for example, the 2D conductive structure 302 and the isolation structure 305 may have different etch rates. As shown in FIG. 10C, the edge of the bottom part 304a-4 abutting the isolation structure 305 may be perpendicular to the bottom of the middle part 303a-4 while the edge of the bottom part 304a-4 abutting the 2D conductive structure 302 may be inclined. In some alternative embodiments, the edge of the bottom part 304a-4 abutting the isolation structure 305 may be inclined while the edge of the bottom part 304a-4 abutting the 2D conductive structure 302 may be perpendicular to the bottom of the middle part 303a-4.

Figure 11:
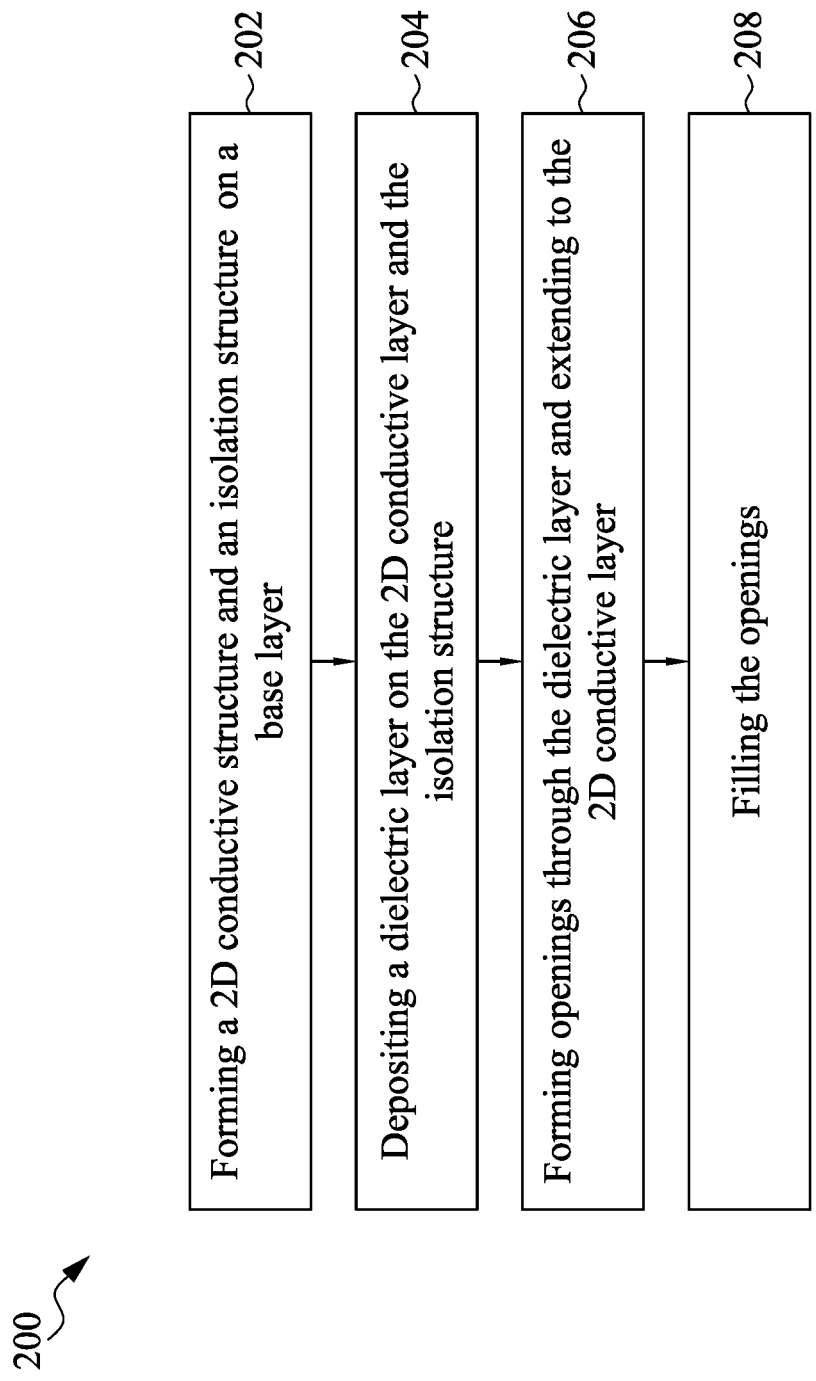
FIG. 11 is a flowchart of a method for forming a semiconductor structure according to various aspects of the present disclosure.

FIG. 11 is a flowchart representing a method 200 for forming a semiconductor structure according to various aspects of the present disclosure. In some embodiments, the method for forming the semiconductor structure can be used in a method for forming a MEOL connecting structure. In some embodiments, the method for forming the semiconductor structure can be used in a method for forming a MEOL connecting structure. In some embodiments, the method for forming the semiconductor structure can be used in a method for forming a BEOL connecting structure. In some embodiments, the method 200 for forming the semiconductor structure includes a number of operations (202, 204, 206 and 208). The method 200 for forming the semiconductor structure will be further described according to one or more embodiments. It should be noted that the operations of the method 200 may be rearranged or otherwise modified within the scope of the various aspects. It should further be noted that additional processes may be provided before, during, and after the method 200, and that some other processes may be only briefly described herein. FIGS. 12 to 23 are diagrammatic cross-sectional side views illustrating various stages in the method 200 for forming the connecting structure according to aspects of one or more embodiments of the present disclosure.

Figure 12:
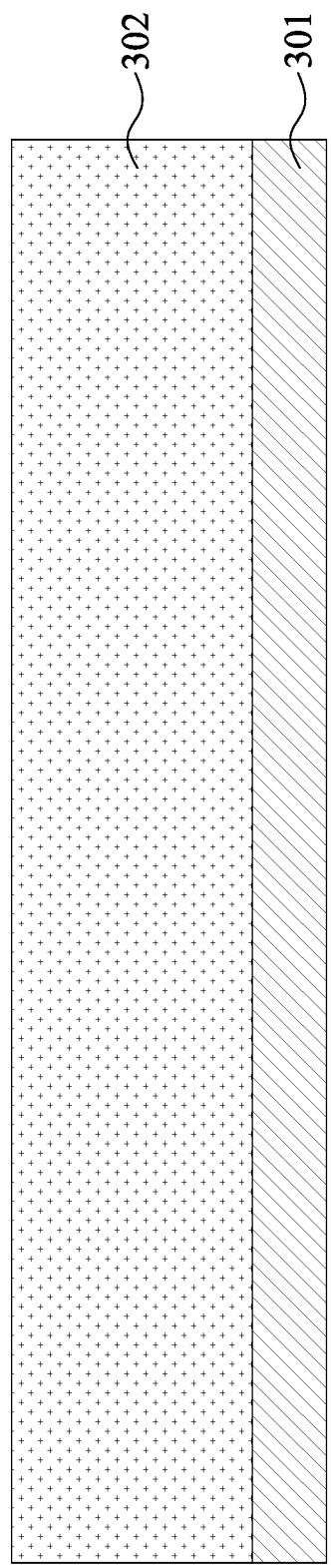
FIGS. 12 to 23 illustrate diagrammatic cross-sectional side views of a semiconductor structure at various stages of fabrication, according to the method of FIG. 11.

As shown in FIG. 12, method 200 begins at operation 202 by forming a 2D conductive structure 302 and an isolation structure 305 on a base layer 301. In some embodiments, a base layer 301 is received or provided. The base layer 301 can be a low-k dielectric layer, but the disclosure is not limited thereto. In some embodiments, the base layer 301 may include a substrate (wafer) with several semiconductor devices, such as the transistors, though not shown. The 2D conductive structure 302 is formed on the base layer 301 in accordance with some embodiments. Suitable materials for forming the 2D conductive structure 302 include, for example, graphene, hexagonal boron nitride (h-BN), transition metal dichalcogenide (TMD) or a mixture thereof. Generally, a thin layer such as one or a few monolayers of 2D materials is deposited onto the base layer 301.

In some embodiments, one or a few monolayers of 2D materials may be formed onto the base layer 301 to build the 2D conductive structure 302 using, for example, chemical vapor deposition (CVD), atmospheric pressure CVD (APCVD), low-pressure CVD (LPCVD) at a sub-atmospheric pressure, plasma enhanced CVD (PECVD), atomic layer CVD (ALCVD), or combinations thereof. For example, one or a few monolayers of graphene may be prepared by mechanical exfoliation of highly-oriented graphite. Another method of growing graphene is the thermal decomposition of SiC where Si atoms are removed and carbon atoms left behind form graphene-like structures in the surface layers. Other methods, such as chemical synthesis, transfer technique and so on, may be used.

Figure 13:
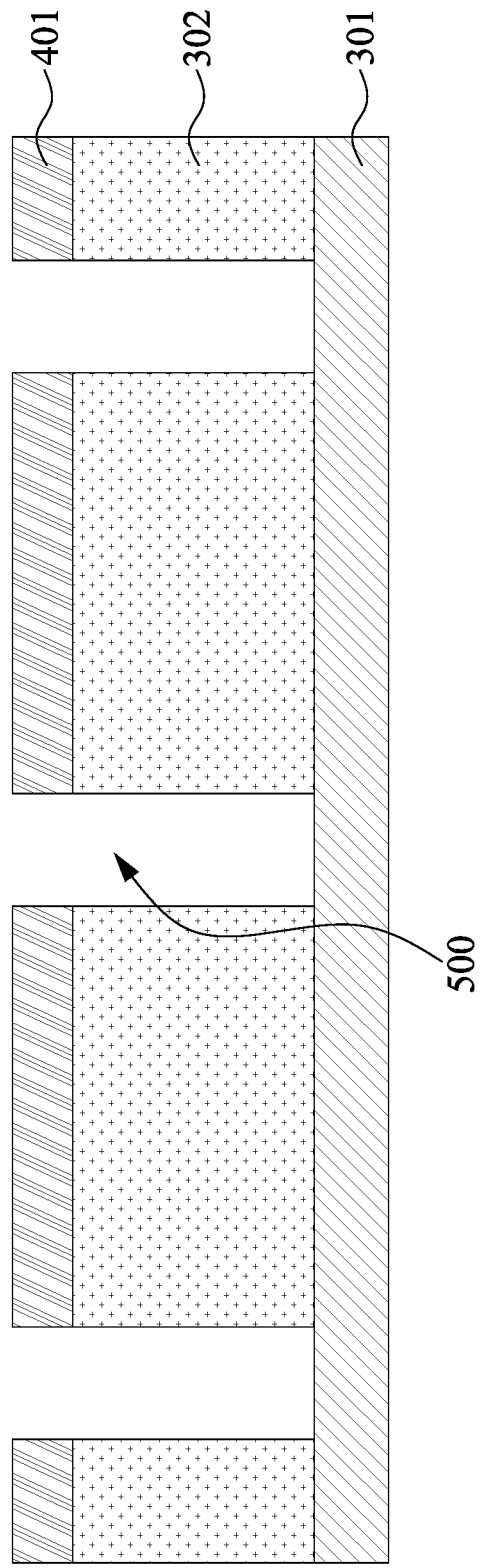

Referring to FIG. 13, in some embodiments, the 2D conductive structure 302 is patterned to form at least one isolation trench 500 by an etching process (for example, by using a dry etching and/or wet etching). For example, the dry etch process may be performed with etchants, including oxygen-containing gas/plasma or other suitable gas/plasma, and/or its combination. A hard mask 401 may be applied onto the 2D conductive structure 302 before applying the etching process. The hard mask 401 may comprise a metal material, such as Ti, TiN, Ta, TaN, Al, and the like, although non-metallic hard masking schemes such as $SiO_2$, SiC, SiN, and SiON may also be used.

Figure 14:
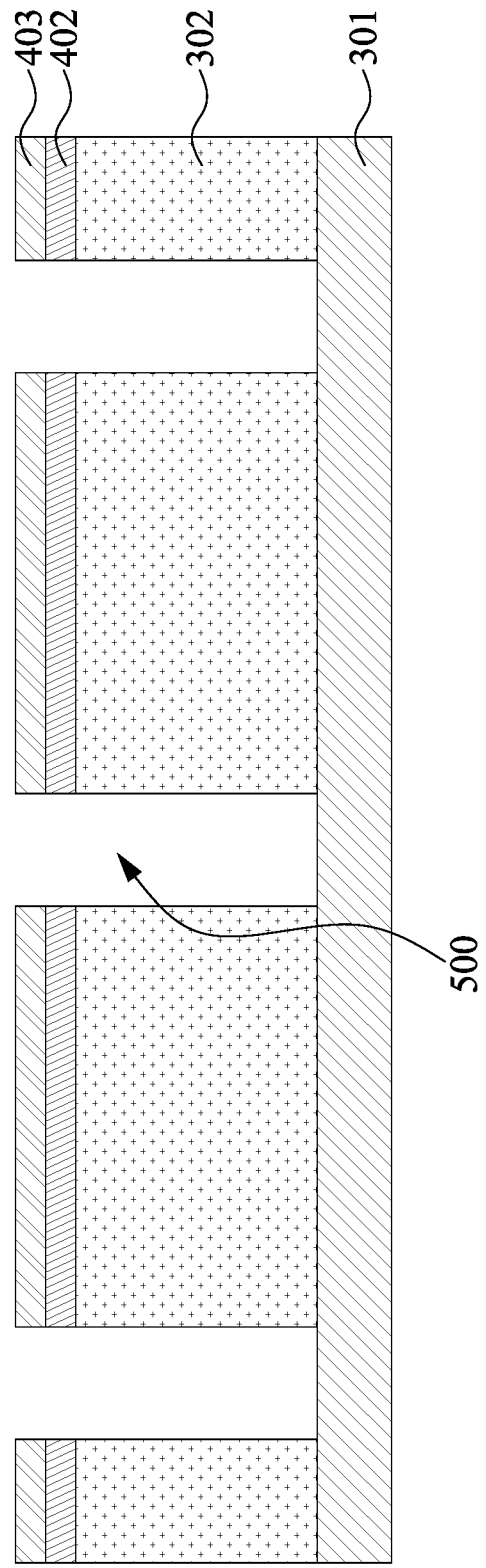

As shown in FIG. 14, an intercalation operation can be performed before or after the isolation trench 500 is formed. In some embodiments, the intercalation operation can include CVD, electrochemical process and other suitable methods. In some embodiments, the intercalation operation can be performed at a temperature between approximately 25° C. and approximately 800° C., but the disclosure is not limited thereto. The intercalation operation is performed such that the 2D conductive structure 302 can include intercalation components. The intercalation components can be similar to those described above; therefore, repeated descriptions of such details are omitted for brevity. To alleviate the accumulation of the intercalation components on the surface of the 2D conductive structure 302, the hard mask 401 may be left after the 2D conductive structure 302 is patterned. Additionally or alternatively, the hard mask 401 may be replaced with one or more protective layers. For example, the hard mask 401 may be removed by cleaning steps; and as shown in FIG. 14, an adhesion layer 402 and a barrier layer 403 may be applied on the top of the 2D conductive structure 302, so the intercalation components may efficiently diffuse into the 2D conductive structure 302 along interfaces of the 2D conductive structure 302 and the isolation trench 500. Additionally, the protective layers may further protect the top of the 2D conductive structure 302 in the planarization (such as a CMP operation) in later steps.

Figure 15:
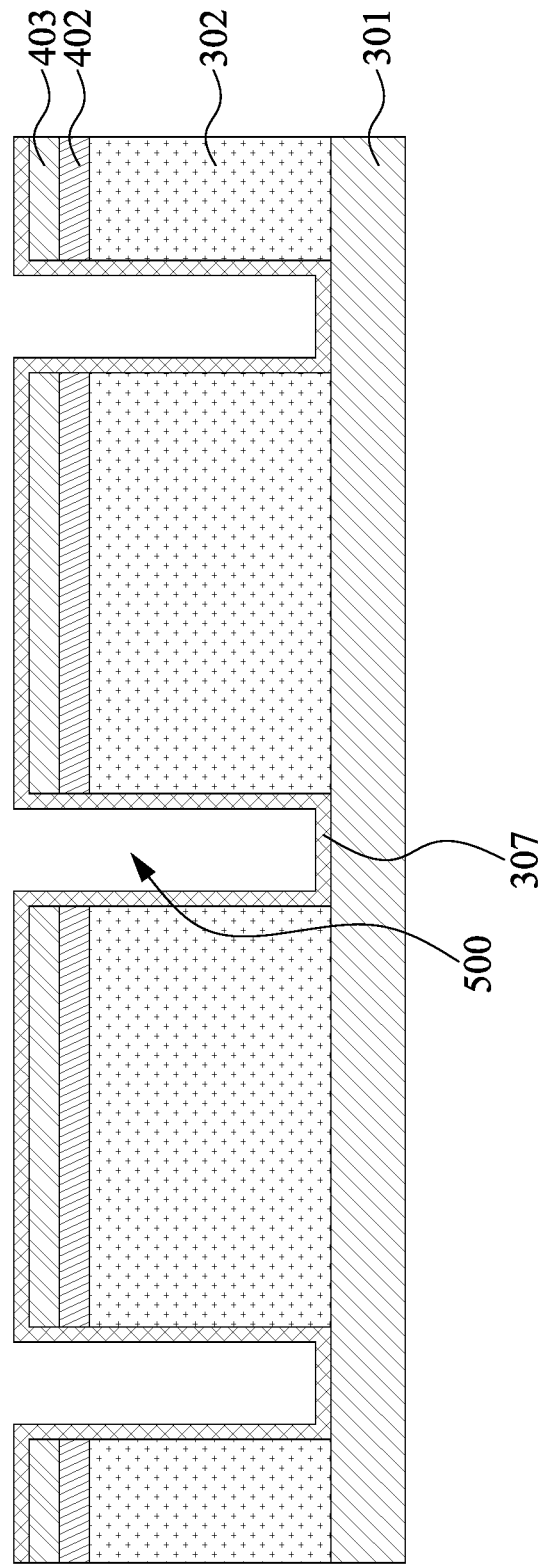
Figure 16:
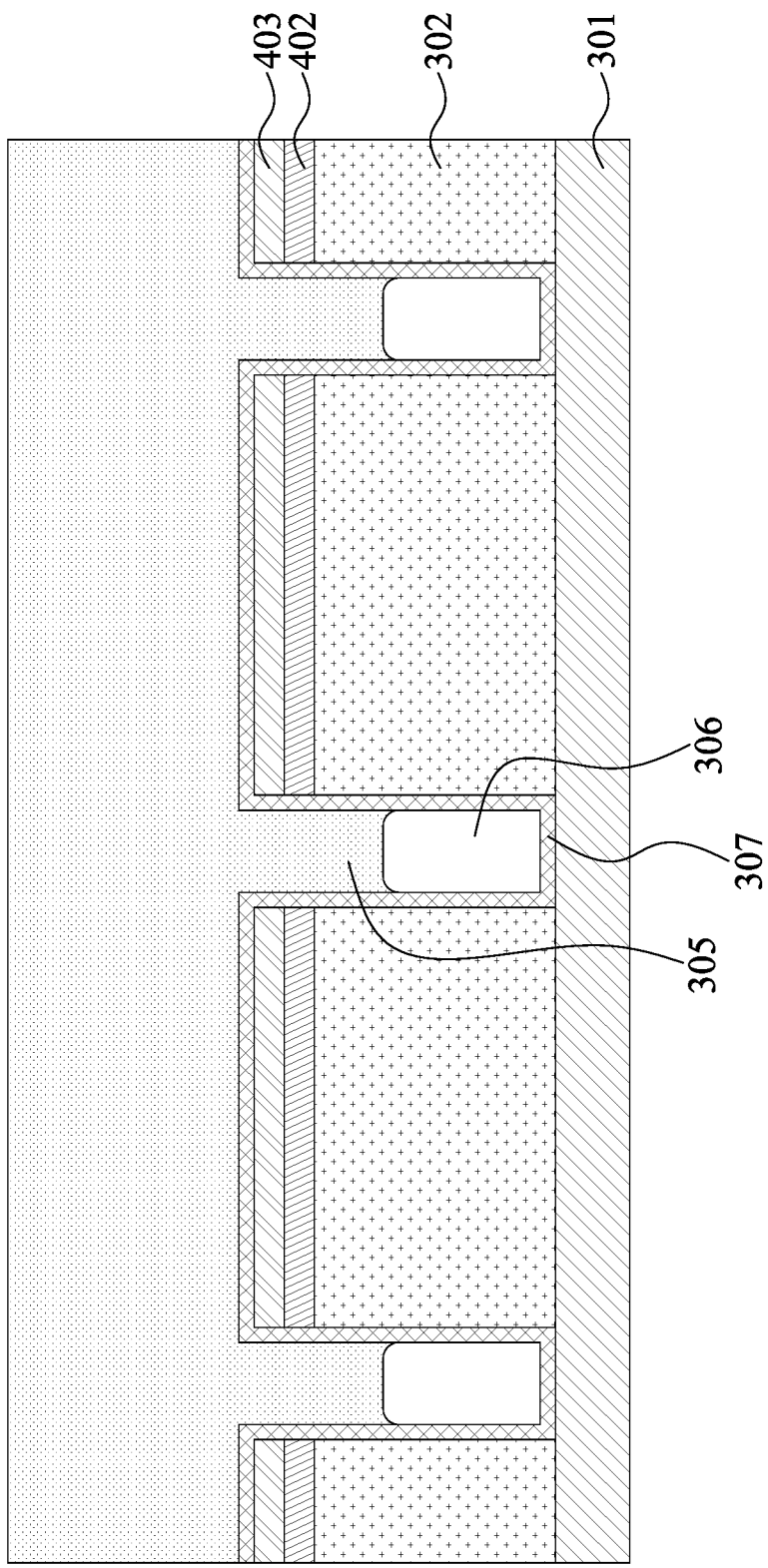
Figure 17:
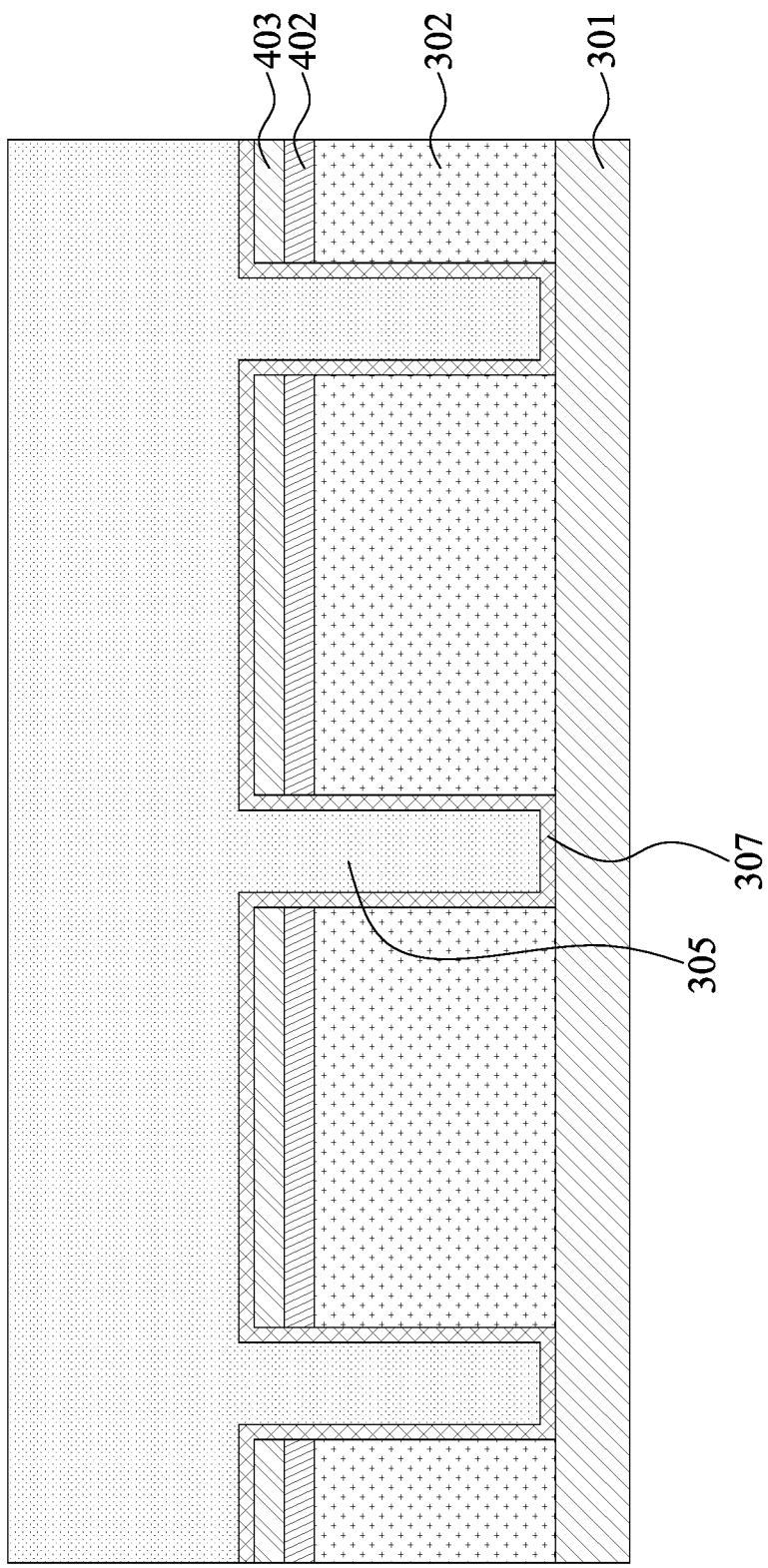

As shown in FIG. 15, in some embodiments, the formation of the isolation structure 305 includes forming a liner 307 to cover sidewalls and bottoms of the isolation trench 500. In addition, the liner 307 also covers the protective layers. As shown in FIG. 16, the formation of the isolation structure 305 further includes applying dielectric materials over the liner 307. In some embodiments, the formation of the isolation structure 305 includes applying dielectric materials to seal the isolation trench 500 and leaving an air gap 306 within the isolation trench 500. The air gap 306 also serves as the isolation structure. Referring to FIG. 17, in some alternative embodiments, the formation of the isolation structure 305 includes filling the trench 305 with the dielectric materials and thus the liner 307 is overlaid with the dielectric materials without forming an air gap. Thus, the isolation structure 305 including the dielectric materials and the liner 307 is obtained.

Figure 18:
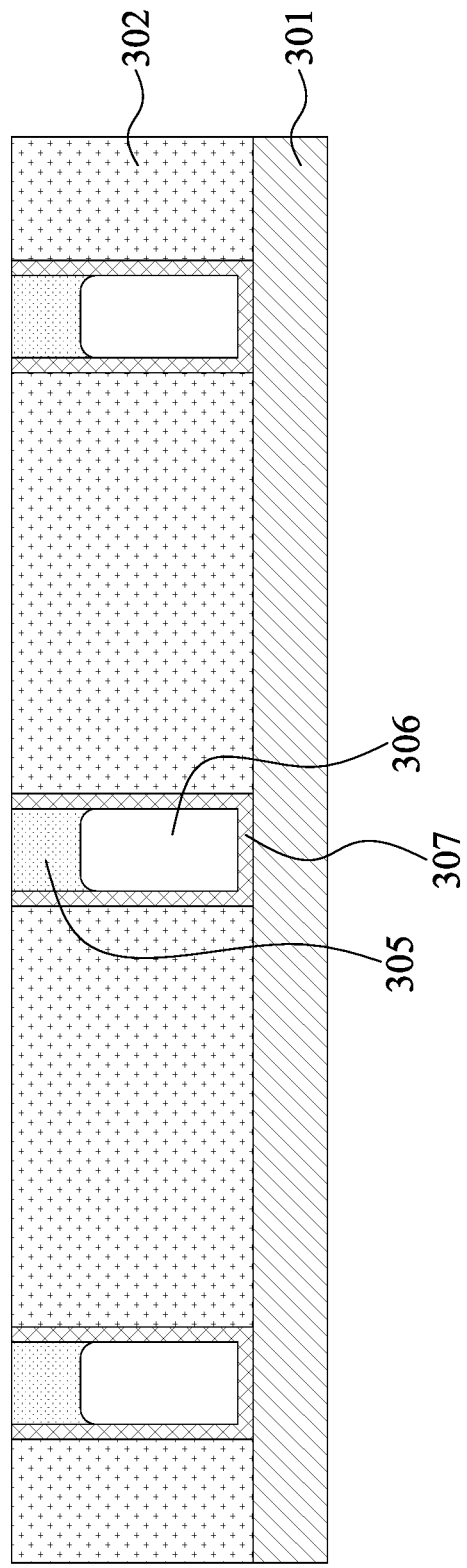

Referring to FIG. 18, superfluous portions of the dielectric materials, the liner 307 and the protective layers can be removed by a planarization operation, such as a chemical mechanical polishing (CMP) operation. Materials of the liner 307 and the dielectric materials used for forming the isolation structure 305 can be similar to those described above; therefore, repeated descriptions of such details are omitted for brevity.

Figure 19:
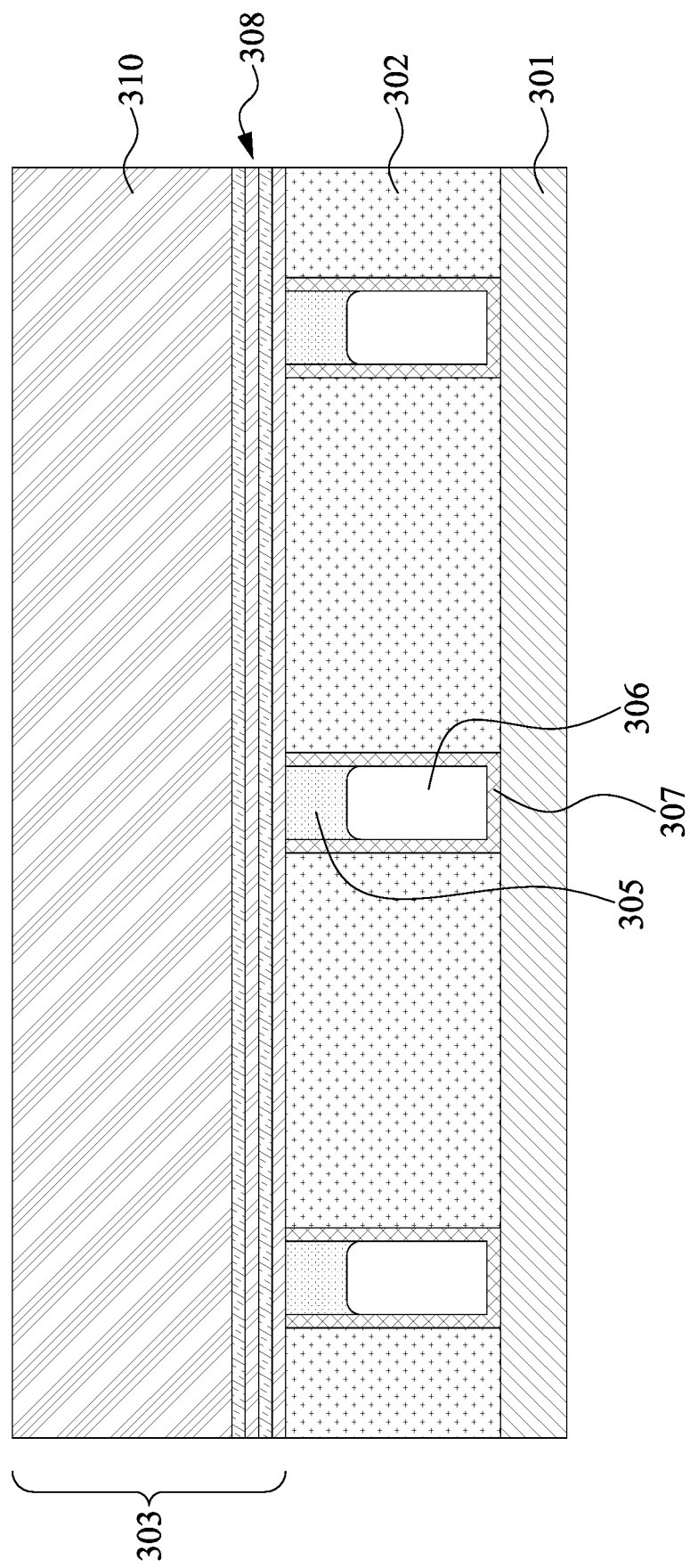

At operation 204, as shown in FIG. 19, in some embodiments, a dielectric structure 303 can be deposited on the 2D conductive structure 302 and the isolation structure 305. As mentioned above, the dielectric structure 303 can include a multi-layered structure. For example, the formation of the dielectric structure 303 may include applying an LOLO structure 308 on the 2D conductive structure 302 and the isolation structure 305 and forming a dielectric layer 310 on the LOLO structure 308, but the disclosure is not limited thereto.

Figure 20:
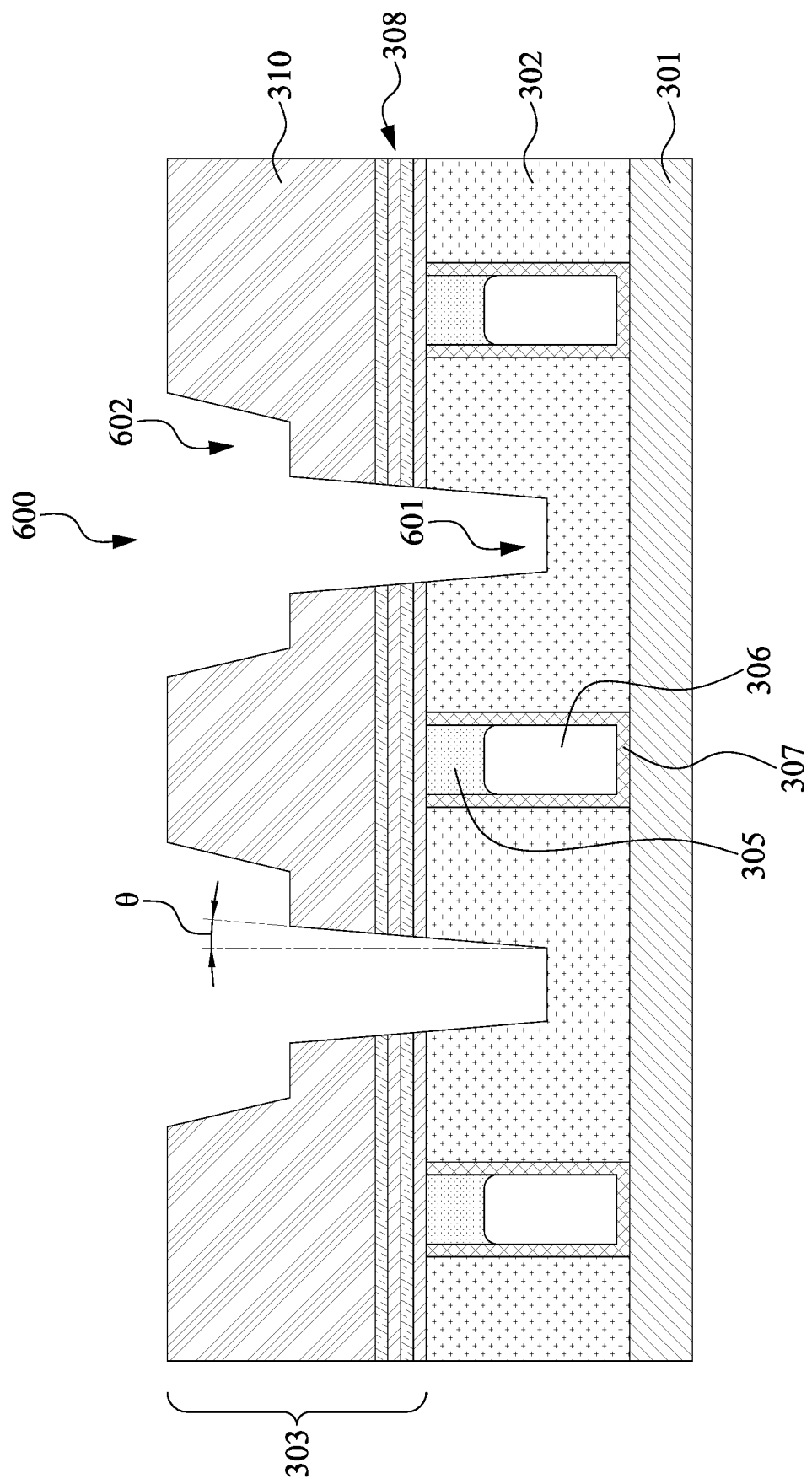
Figure 22:
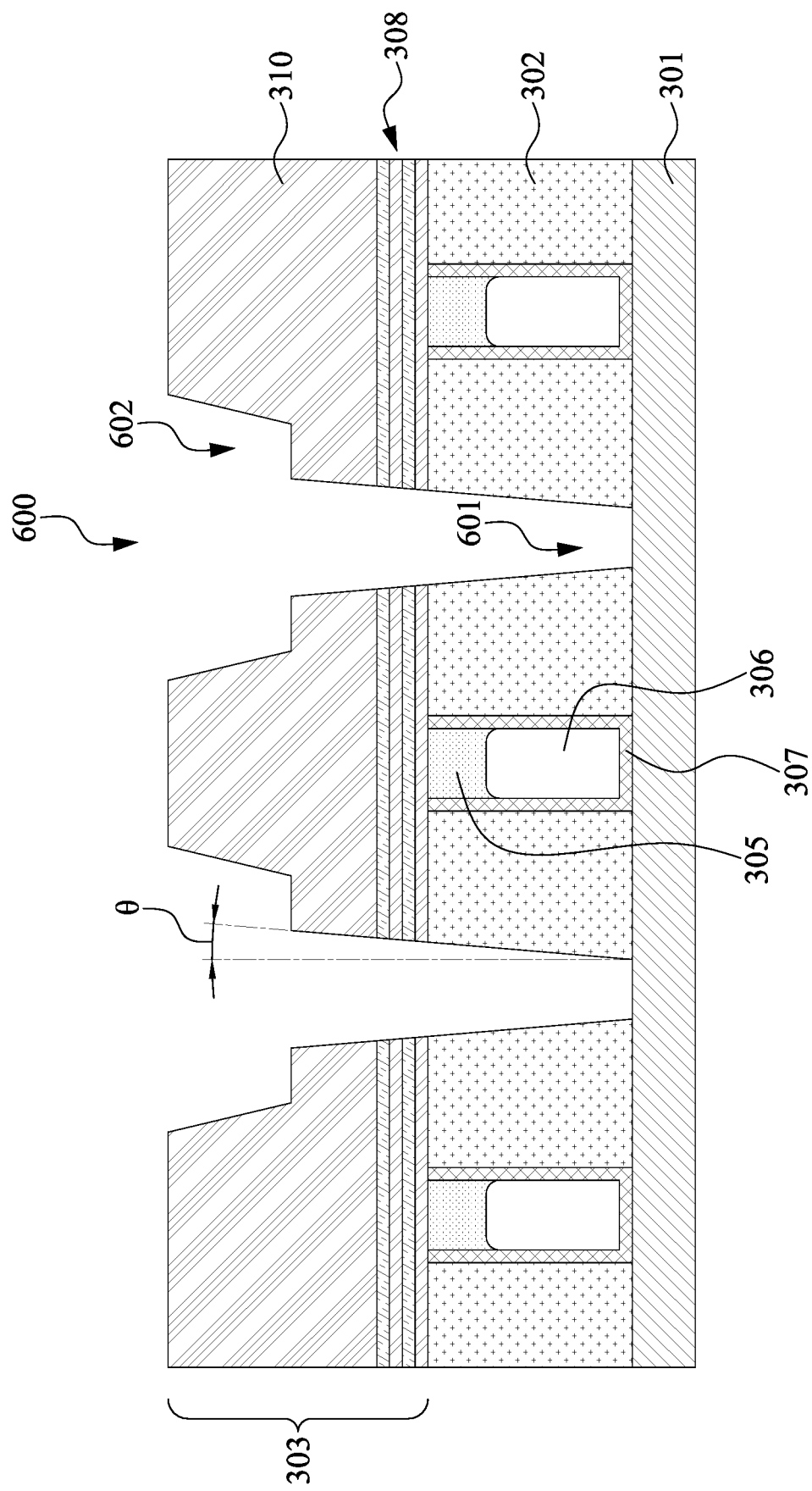

The method 200 then proceeds to operation 206 where openings 600 are formed through the dielectric structure 303, wherein the openings 600 extend into the 2D conductive structure 302. As shown in FIGS. 20 and 22, in some embodiments, a plurality of openings 600 can be formed in the dielectric structure 303. In some embodiments, the opening 600 can include a via opening 601 and a trench 602. The via opening 601 and the trench 602 are coupled to each other. The openings 600 (including the via opening 601 and the trench 602) can be formed by any suitable operation such as single or dual damascene formation operations, and descriptions of such details are omitted for brevity. The trench 602 is formed in the dielectric structure 303 and the via opening 601 is formed in the dielectric structure 303 and extends into the 2D conductive structure 302, so an upper portion of the via opening 601 is in the dielectric structure 303 while the lower portion is in the 2D conductive structure 302. The depth of the via opening 601 can be controlled as desired. In some embodiments, as shown in FIG. 20, the via opening 601 extends into the 2D conductive structure 302 in a depth of about 10% to about 95% of the total thickness of the 2D conductive structure 302. In some embodiments, the via opening 601 extends into the 2D conductive structure 302 in a depth of about 35% to about 90% of the total thickness of the 2D conductive structure 302. In some embodiments, the via opening 601 extends into the 2D conductive structure 302 in a depth of about 50% to about 85% of the total thickness of the 2D conductive structure 302. In some embodiments, as shown in FIG. 22, the depth of the via opening 601 can be increased to expose the base layer 301, which is under the 2D conductive structure 302.

When forming the opening 600, the via opening 601 and the trench 602 can be designed to have various shapes, sizes and the like. For example, as shown in FIGS. 20 and 22, the via opening 601 has a diameter at an interface of the 2D conductive structure 302 and the dielectric structure 303 larger than that at the bottom of via opening 601, so the surface of the 2D conductive structure 302 exposing to the via opening 601 is titled with an tilt angle θ, which is in a range from 0° to about 75°. In some embodiments, the tilt angle θ ranges from about 5° to about 45°. In some embodiments, the tilt angle θ ranges from about 7.5° to about 15°. By controlling the tilt angle between about 0° and about 75°, the contact surface area between the interconnect structure 304 and the 2D conductive structure 302 can be increased to improve the conductivity of the semiconductor structure 100 without significantly increasing layout area of the interconnect structure 304.

Furthermore, due to different etch rates of the dielectric structure 303 (including the LOLO structure 308 and the dielectric layer 310), the 2D conductive structure 302 and the isolation structure 305, the sidewall of the via opening 601 and the sidewall the trench 602 may present various profiles, such as multi-part profile, so that the interconnect structures 304 formed in the opening 600 as described below, may have a corresponding profile. The profile of the interconnect structures 304 can be similar to those described above in view of FIGS. 10A, 10B and 10C; therefore, repeated descriptions of such details are omitted for brevity.

Figure 21:
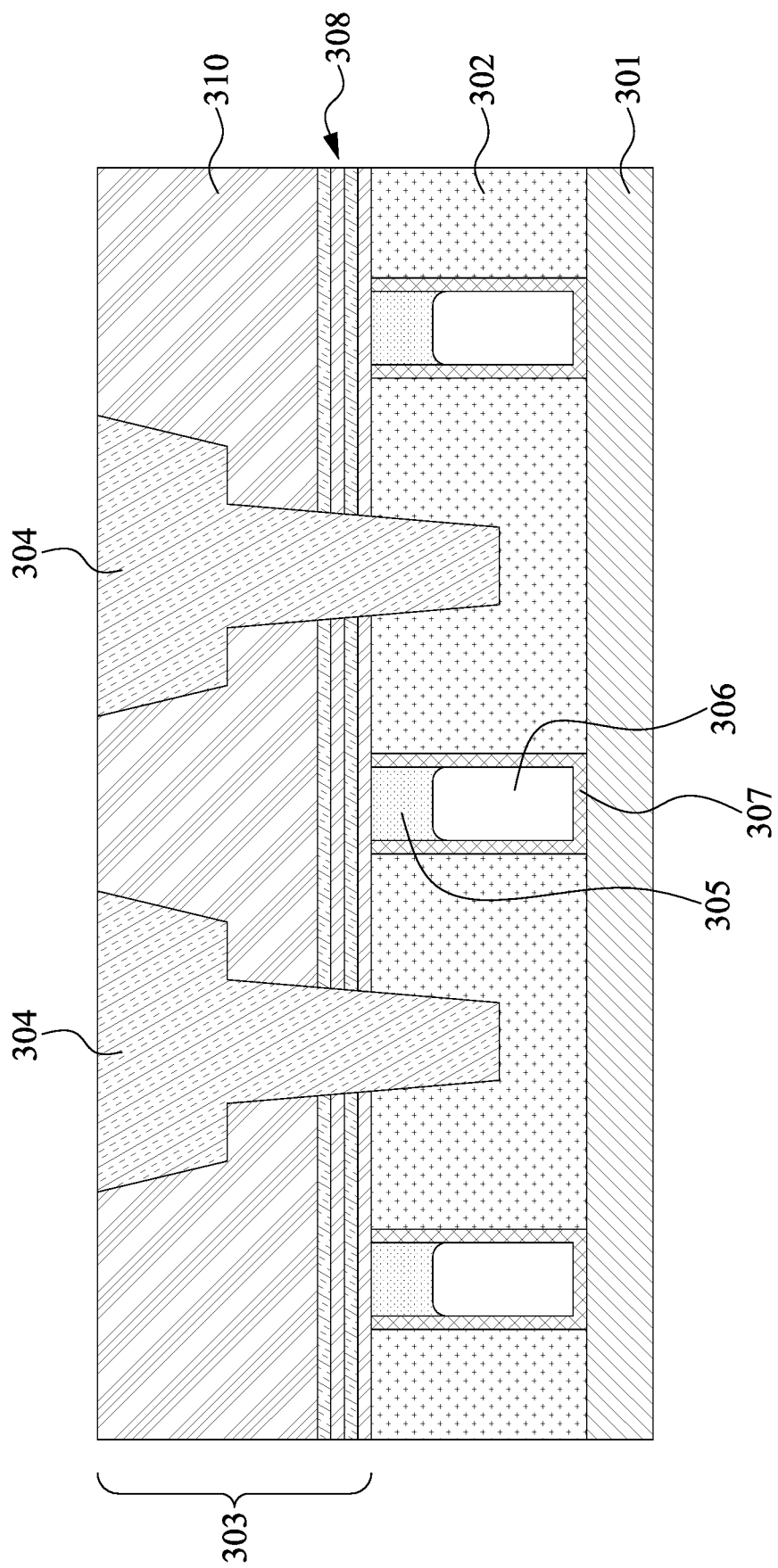
Figure 23:
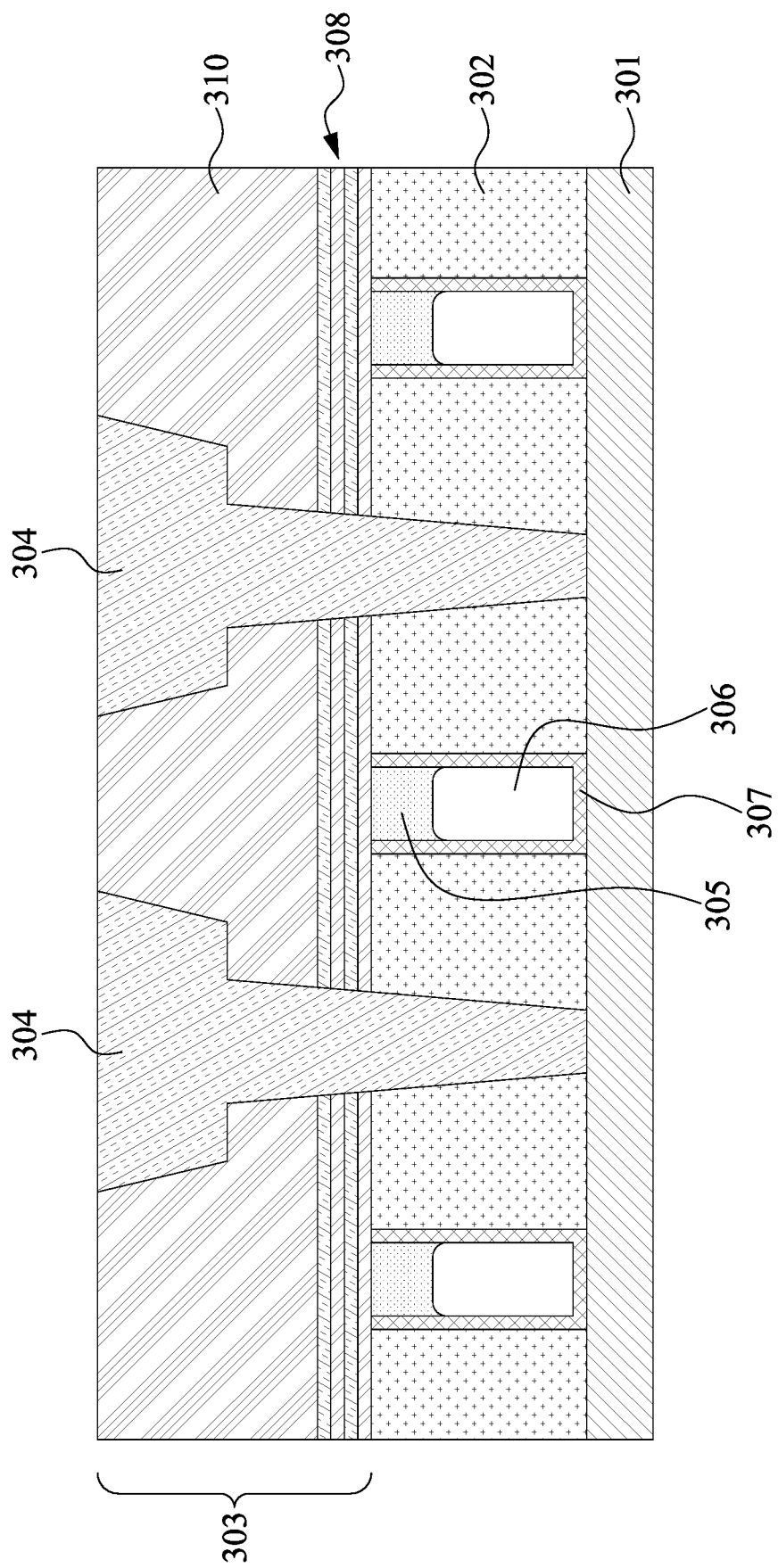

At operation 208, as shown in FIGS. 21 and 23, the openings 600 (including the via opening 601 and the trench 602) are filled with conductive materials to form interconnect structures 304, so that a portion of the interconnect structure 304 laterally contacts at least one edge of the 2D conductive structure 302. In some embodiments, the interconnect structure 304 comprises 3D materials, including metallic materials, such as copper, tungsten and so on, as mentioned above. A barrier layer (not shown) may be applied before filling the openings 600 to cover bottoms and sidewalls of the openings 600. A planarization, such as a CMP operation, can be performed to remove superfluous portions of the conductive material and the barrier layer.

As illustrated in FIG. 21, due to different depth of the via opening 601, the interconnect structure 304 may extend into the 2D conductive structure 302 in a depth of at least about 10% of the total thickness of the 2D conductive structure 302. In some embodiments, the interconnect structure 304 may extend into the 2D conductive structure 302 in a depth of at least about 35% of the total thickness of the 2D conductive structure 302. In some embodiments, the interconnect structure 304 may extend into the 2D conductive structure 302 in a depth of at least about 50% of the total thickness of the 2D conductive structure 302. In some other embodiments, as shown in FIG. 23, the interconnect structure 304 may extend through the 2D conductive structure 302 and contact the base layer 301, so the sidewall of the interconnect structure 304 abuts the 2D conductive structure 302 while the bottom of the interconnect structure 304 contacts the base layer 301.

Due to the tilt angle θ of the via opening 601, the interconnect structure 304 may have a tapered vertical cross sectional shape with a first diameter D1 at an interface of the 2D conductive structure 302 and the dielectric structure 303 and a second diameter D2 at the bottom of the interconnect structure 304 as illustrated in FIGS. 3A and 5A. The first diameter D1 is wider than the second diameter D2 to increase the contact surface area between the interconnect structure 304 and the 2D conductive structure 302 and thus improve conductivity of the semiconductor structure 100 as mentioned above; repeated descriptions of such details are omitted for brevity.

In summary, by arranging the 2D conductive structure 302 and interconnect structure 304, the benefit of the small lateral resistance of 2D material can be utilized to improve the conductivity of the semiconductor structure, such that increased-resistance issue of the semiconductor structure can be mitigated while reducing size. Such heterogeneous integration of the 2D materials of the 2D conductive structure 302 and 3D materials of the interconnect structure 304 can be used to form MEOL connecting structures, such as a contact or a plug, or can be used to form BEOL connecting structures such as conductive lines that are connected to each other by vias, or can even be used in FEOL.

In some embodiments, a semiconductor structure comprises at least one two-dimensional (2D) conductive structure; a dielectric structure disposed on the 2D conductive structure; and at least one interconnect structure disposed in the dielectric structure and extending into the 2D conductive structure, wherein the interconnect structure laterally contacts the 2D conductive structure.

In some embodiments, a semiconductor structure comprises a plurality of 2D conductive structures; an isolation structure separating the 2D conductive structures; a dielectric structures longitudinally stacked on the 2D conductive structures and the isolation structure; and at least one interconnect structure disposed in the dielectric structure and extending along an interface between the 2D conductive structure and the isolation structure; wherein the interconnect structure partially contacts the 2D conductive structure and partially contacts the isolation structure.

In some embodiments, a method of manufacturing a semiconductor structure comprises stacking a dielectric structures on a 2D conductive structure; forming openings through the dielectric structures, wherein the openings extend into the 2D conductive structure; and filling the openings with 3D materials, so that the 3D materials laterally contacts the 2D conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
a plurality of two-dimensional (2D) conductive structures;
an isolation structure separating the 2D conductive structures;
a dielectric structure longitudinally stacked on the 2D conductive structures and the isolation structure; and
at least one interconnect structure disposed in the dielectric structure and extending along an interface between one of the 2D conductive structures and the isolation structure, so that the interconnect structure partially contacts the one of the 2D conductive structures and partially contacts the isolation structure,
wherein the interconnect structure includes a bottom part disposed between the one of the 2D conductive structures and the isolation structure,
wherein a top of each of the 2D conductive structures and a top of the isolation structure are coplanar, and
wherein the bottom part of the interconnect structure has a tapered vertical cross sectional shape.

2. The semiconductor structure of claim 1, wherein the isolation structure comprises dielectric materials, air gaps or a mixture thereof.

3. The semiconductor structure of claim 1, wherein a vertical cross section of the bottom part of the interconnect structure is symmetric.

4. The semiconductor structure of claim 1, wherein a vertical cross section of the bottom part of the interconnect structure is asymmetric.

5. The semiconductor structure of claim 1, wherein an edge of the bottom part abutting the isolation structure is perpendicular to a bottom of the dielectric structure while an edge of the bottom part abutting the one of the 2D conductive structures is inclined.

6. The semiconductor structure of claim 1, wherein the interconnect structure has a stepwisely decreased width from a part located in the dielectric structure to a part located between the one of the 2D conductive structures and the isolation structure.

7. The semiconductor structure of claim 1, wherein the interconnect structure extends into the one of the 2D conductive structures in a depth of about 10% to about 90% of a thickness of the one of the 2D conductive structures.

8. The semiconductor structure of claim 1, wherein the bottom part of the interconnect structure has a first diameter at an interface of the one of the 2D conductive structures and the dielectric structure; and a second diameter at the bottom of the interconnect structure, wherein the first diameter is larger than the second diameter.

9. A semiconductor structure, comprising:
a plurality of two-dimensional (2D) conductive structures;
an isolation structure separating the 2D conductive structures;
a dielectric structure longitudinally stacked on the 2D conductive structures and the isolation structure; and
at least one interconnect structure disposed in the dielectric structure and extending along an interface between one of the 2D conductive structures and the isolation structure, so that the interconnect structure partially contacts the one of the 2D conductive structures and partially contacts the isolation structure,
wherein the interconnect structure includes a bottom part disposed between the one of the 2D conductive structures and the isolation structure,
wherein a top of the one of the 2D conductive structures and a top of the isolation structure are coplanar,
wherein a lower surface of the bottom part of the interconnect structure, a bottom of the one of the 2D conductive structures and a bottom of the isolation structure are coplanar, and
wherein the bottom part of the interconnect structure has a tapered vertical cross sectional shape.

10. The semiconductor structure of claim 9, wherein the isolation structure comprises a liner surrounding the bottom and a sidewall of the isolation structure.

11. The semiconductor structure of claim 10, wherein the isolation structure comprises dielectric materials, air gaps or a mixture thereof.

12. The semiconductor structure of claim 9, wherein an edge of the bottom part abutting the isolation structure is perpendicular to the bottom of the dielectric structure while an edge of the bottom part abutting the one of the 2D conductive structures is inclined.

13. The semiconductor structure of claim 9, wherein a diameter of an upper surface of the bottom part of the interconnect structure is larger than a diameter of the lower surface of the bottom part of the interconnect structure.

14. The semiconductor structure of claim 9, wherein the interconnect structure comprises a three-dimensional (3D) material, and the plurality of the 2D conductive structures comprise 2D materials including graphene, hexagonal boron nitride (h-BN), transition metal dichalcogenide or a mixture thereof.

15. A semiconductor structure, comprising:
a plurality of two-dimensional (2D) conductive structures;
an isolation structure separating the 2D conductive structures;
a dielectric structure longitudinally stacked on the 2D conductive structures and the isolation structure; and
at least one interconnect structure disposed in the dielectric structure and extending along an interface between one of the 2D conductive structures and the isolation structure, so that the interconnect structure partially contacts the one of the 2D conductive structures and partially contacts the isolation structure,
wherein the interconnect structure includes a bottom part disposed between the one of the 2D conductive structures and the isolation structure,
wherein a top of the one of the 2D conductive structures and a top of the isolation structure are coplanar,
wherein a thickness of the isolation structure and a thickness of the plurality of 2D conductive structures are identical, and
wherein the bottom part of the interconnect structure has a tapered vertical cross sectional shape.

16. The semiconductor structure of claim 15, wherein the interconnect structure extends into the one of the 2D conductive structures in a depth of about 10% to about 90% of the thickness of the one of the 2D conductive structures.

17. The semiconductor structure of claim 15, wherein the plurality of 2D conductive structures comprises 2D materials including graphene, hexagonal boron nitride (h-BN), transition metal dichalcogenide or a mixture thereof.

18. The semiconductor structure of claim 17, wherein the plurality of 2D conductive structures comprises the 2D materials intercalated with metal, organic materials, inorganic materials, polymer or a combination thereof.

19. The semiconductor structure of claim 15, wherein the isolation structure comprises dielectric materials, air gaps or a mixture thereof.

20. The semiconductor structure of claim 15, wherein the isolation structure comprises dielectric materials and air gaps.

* * * * *